(12) United States Patent
Tai et al.

(10) Patent No.: US 7,384,810 B2
(45) Date of Patent: Jun. 10, 2008

(54) IMAGE DISPLAY DEVICE AND METHOD FOR MANUFACTURING THE SAME

(75) Inventors: Mitsuharu Tai, Kokubunji (JP);
Mutsuko Hatano, Kokubunji (JP);
Takeshi Sato, Kokubunji (JP);
Seongkee Park, Yeongchen (KR);
Kiyoshi Ouchi, Kodaira (JP)

(73) Assignee: Hitachi Displays, Ltd., Hayano Mobara-Shi (JP)

( * ) Notice: Subject to any disclaimer, the term of this patent is extended or adjusted under 35 U.S.C. 154(b) by 160 days.

(21) Appl. No.: 11/441,021

(22) Filed: May 26, 2006

(65) Prior Publication Data

US 2006/0267011 A1 Nov. 30, 2006

(30) Foreign Application Priority Data

May 26, 2005 (JP) ............................. 2005-153734

(51) Int. Cl.
*H01L 21/00* (2006.01)
(52) U.S. Cl. ........................ 438/30; 438/97; 438/166; 438/417; 438/949; 257/E21.134; 257/E21.572; 257/E33.003; 257/E31.04
(58) Field of Classification Search ............... 438/30
See application file for complete search history.

(56) References Cited

U.S. PATENT DOCUMENTS

2005/0003591 A1* 1/2005 Takaoka et al. ............ 438/151

(Continued)

FOREIGN PATENT DOCUMENTS

JP 2004-022648 1/2004

OTHER PUBLICATIONS

A. Hara, et al.; "High Performance Poly-Si TFTs on a Glass by a Stable Scanning CW Laser Lateral Crystallization"; IEEE Electron Device Letters; 2001.*

(Continued)

*Primary Examiner*—Walter Lindsay, Jr.
*Assistant Examiner*—Abdulfattah Mustapha
(74) *Attorney, Agent, or Firm*—Antonelli, Terry, Stout & Kraus, LLP.

(57) ABSTRACT

Only a region where TFTs constituting a high-performance circuit will be disposed in a precursor semiconductor film PCS on an insulating substrate GLS with an insulating layer UCL serving as an undercoat is irradiated with a first energy beam LSR so as to be poly-crystallized while growing crystal grains laterally. Further a second rapid thermal treatment is performed all over the panel so as to reduce defects in the crystal grains in a region PSI poly-crystallized by the aforementioned energy beam. Thus, a high-quality polycrystalline semiconductor thin film serving as TFTs for a high-performance circuit and having a high on-current, a low threshold value, a low variation and a sharp leading edge characteristic is obtained. Concurrently, the precursor semiconductor layer in the other region is poly-crystallized by the second rapid thermal treatment so as to obtain a low-quality polycrystalline semiconductor thin film serving as pixel circuit TFTs and having a low on-current and properties of a low leak current and a high withstand voltage due to its high resistance. Accordingly, it is possible to form polycrystalline semiconductor TFTs high in driving performance and TFTs having properties of a low leak current and a high withstand voltage concurrently on one and the same insulating substrate.

8 Claims, 19 Drawing Sheets

U.S. PATENT DOCUMENTS

2006/0003478 A1* 1/2006 Hongo et al. .................. 438/29

OTHER PUBLICATIONS

M. Hatano, et al.; "Late-News Paper: Selectively Enlarging Lase Crystallization Technology for High and Uniform Performance Poly-Si TFTs"; Society for Information Display; pp. 158-161; 2002.*

C-W Kim, et al.; "Development of SLS-Based System on Glass Display"; Society for Information Display; pp. 868-871; 2004.*

M.A. Crowder, et al.; "Low-Temperature Single-Crystal Si TFTs Fabricated on Si Films Processed via Sequential Lateral Solidification"; IEEE Electron Device Letters; vol. 19; No. 8; pp. 306-308; 1998.*

* cited by examiner 200 nm 200 nm 50 nm

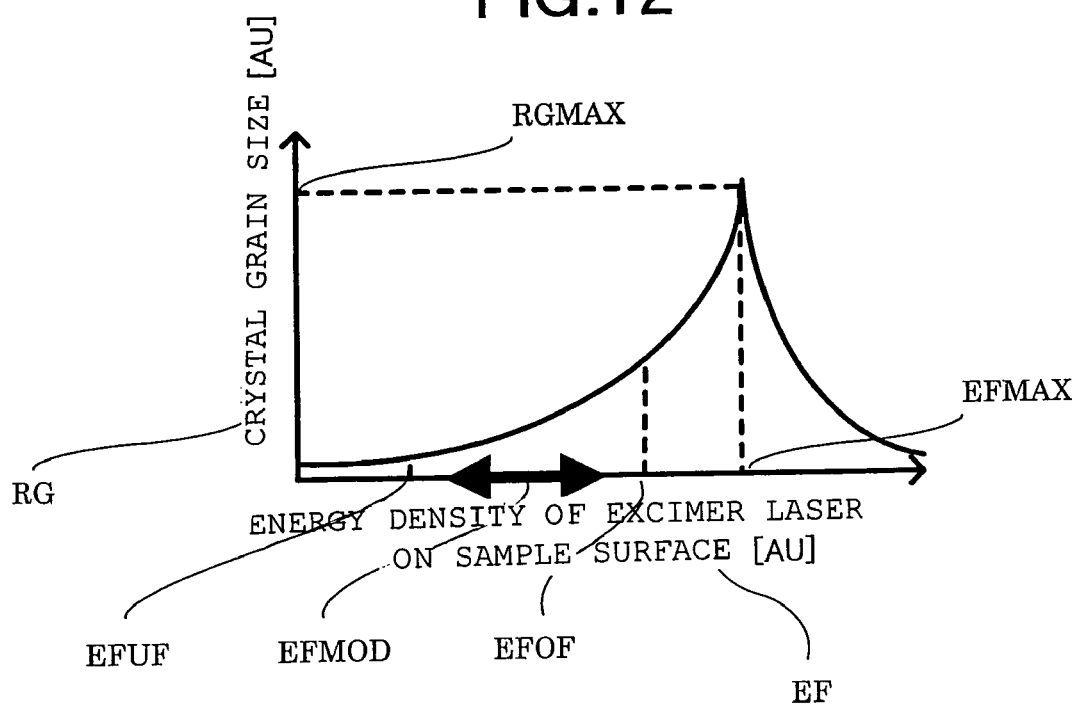

IMAGE DISPLAY DEVICE AND METHOD FOR MANUFACTURING THE SAME

FIELD OF THE INVENTION

The present invention relates to an image display device and a method for manufacturing the same, and particularly relates to an image display device such as a liquid crystal display, an organic EL (Electro-Luminescence) display, an inorganic EL display, an EC (Electro-Chromic) display or the like, using semiconductor thin film transistors manufactured in a low-temperature process and for constituting drive circuits (drivers) and their peripheral circuits for use in the image display device, and a method for manufacturing the image display device.

DESCRIPTION OF THE BACKGROUND ART

Thin film transistors (TFT) whose channels are formed out of polycrystalline semiconductors have been developed as pixels and pixel drive circuit devices in image display devices such as active matrix type liquid crystal displays or organic/inorganic EL displays, or image sensors. The polycrystalline semiconductor TFTs are advantageous due to their high driving capacity as compared with other drive circuit devices. Thus, peripheral drive circuits can be mounted on one and the same glass substrate together with pixels. As a result, it can be expected to customize circuit specification, to reduce the cost due to simultaneous progress of a process for designing pixels and a process for forming the pixels, or to increase the reliability due to avoidance of mechanical vulnerability in a connection portion between a drive LSI and each pixel. The displays will be also referred to as display devices or image display devices herein.

Polycrystalline semiconductor TFTs for a liquid crystal display are formed on a glass substrate in order to reduce the cost. In a process for forming the TFTs on the glass substrate, the heat resistance temperature of the glass substrate defines the process temperature. An ELA (Excimer Laser Annealing) method for melting and recrystallizing a precursor semiconductor layer with an excimer laser has prevailed as a method for forming a high-quality polycrystalline semiconductor thin film without thermally damaging the glass substrate. The driving capacity of a polycrystalline semiconductor TFT obtained in this method is improved to be 100 or more times as high as that of a TFT whose channel is made of an amorphous semiconductor and which has been used in a background-art liquid crystal display. It is therefore possible to mount a part of circuits such as drivers on the glass substrate. In order to mount higher-performance integrated circuits, however, it is necessary to realize polycrystalline semiconductor TFTs having higher driving capacity.

As a method for forming polycrystalline semiconductor TFTs having higher driving capacity, for example, there is a method in which a semiconductor thin film is scanned relatively with a CW laser beam continuously outputting energy or a pulsed laser beam with a longer time than that in the ELA method, so that the semiconductor thin film is irradiated with an energy beam outputting energy continuously or for a fixed time, as disclosed in Non-Patent Document 1 or Non-Patent Document 2. When the melting time of a semiconductor layer is prolonged, crystal grains are grown in the laser scanning direction. Thus, it is possible to obtain a polycrystalline semiconductor thin film having a large crystal grain size and a uniform grain width and having a flat surface. Hereinafter, growth of crystal grains substantially in the laser scanning direction will be also referred to as lateral growth.

As disclosed in Non-Patent Document 3 or Non-Patent Document 4, repetitious multistage irradiation with a pulsed laser beam with a short time as in the ELA method may be performed with the irradiation position being shifted while scanning with the laser. Thus, crystal grains produced by laser irradiation in the first stage are used as nuclei so that crystals are grown laterally. When the crystals are connected with one another, it is possible to obtain a polycrystalline semiconductor thin film having a large crystal gain size in the laser scanning direction and a uniform grain width.

Polycrystalline semiconductor TFTs manufactured in these background-art methods have driving capacity in their N channels two or three or more times as high as that of polycrystalline semiconductor TFTs manufactured by an excimer laser. Thus, more peripheral drive circuits can be mounted on one and the same glass substrate together with pixels.

Non-Patent Document 1: International Electron Devices Meeting (Washington D.C., 2001) pp. 747-751

Non-Patent Document 2: Society For Information Display International Symposium Digest 2002 pp. 158-161

Non-Patent Document 3: Society For Information Display International Symposium Digest 2004, pp. 868-871

Non-Patent Document 4: IEEE Electron Device Letters vol. 19 1998 pp. 306-308

Patent Document 1: JP-A-2004-22648

In a polycrystalline semiconductor thin film grown laterally as typified by Non-Patent Documents 1 to 4, crystal grain boundaries are formed substantially in parallel with the growing direction. On the other hand, in a polycrystalline semiconductor thin film formed in the ELA method according to the background art, crystal grain boundaries have random directions. The crystal grain boundaries behave as inhibitors of electric conduction. When the current direction is parallel to the laterally growing direction in the former polycrystalline semiconductor thin film, the crystal grain boundaries are no longer primary inhibitors of electric conductions but show a good electric conduction characteristic. However, the crystal grains are not single crystals in a strict sense but contain many crystal defects such as dislocations, stacking defects, point defects, etc. Of these crystal grains, there are some serving as inhibitors of electric conductions.

As crystal grain boundaries often observed in a polycrystalline semiconductor thin film grown laterally, small crystal grain boundary groups each composed of three or more linear crystal grain boundaries arranged in parallel with one another and in an interval not larger than 100 nm are distributed. According to the ELA method, the effect of crystal grain boundaries inhibiting electric conduction is so great that these small crystal grain boundary groups as inhibitors do not manifest themselves. However, in a polycrystalline semiconductor thin film grown laterally, the small crystal grain boundary groups become one of main factors in deterioration of the characteristic of polycrystalline semiconductor TFTs and in increase of variation among the devices. For this reason, the performance of the polycrystalline semiconductor TFTs is not equal to the performance of mono-crystalline semiconductor TFTs, so that circuits the polycrystalline semiconductor TFTs can constitute are limited.

In order to mount drive circuits or peripheral circuits (hereinafter also referred to as peripheral drive circuits) on one and the same glass substrate together with pixels, TFTs having different specifications have to be formed on the same glass substrate together. For example, in a liquid crystal display device, TFTs constituting a pixel circuit thereof have to satisfy properties of a low leak current and a high withstand voltage. On the other hand, TFTs constituting a peripheral drive circuit for processing an external input signal and converting the signal into an analog signal are requested to have a high on-current, a low threshold value, a low variation and a steep rising edge. There is no polycrystalline semiconductor thin film for supplying TFTs satisfying these specifications simultaneously. It is therefore necessary to produce polycrystalline semiconductor thin films having different film qualities on one and the same glass substrate.

As a method in which polycrystalline semiconductor thin films having difference film qualities are produced on one and the same glass substrate, there is a method including a first irradiation step in which a silicon material is irradiated with a CW laser and a second irradiation step in which at least a part of the silicon material is irradiated with a pulsed laser beam in an oxygen-containing atmosphere, wherein the film surface is oxidized and formed into a thin film by abrasion in the first and second irradiation steps, as disclosed in Patent Document 1. According to this method, it is supposed that two kinds of polycrystalline semiconductor thin films having different film thicknesses can be produced on one and the same glass substrate. In this method, however, the polycrystalline semiconductor thin film obtained in the first irradiation step is not reformed so that the inhibitors of electric conduction as described above cannot be removed. It is also difficult to control the film thickness by abrasion. In addition, in order to obtain the effect of reduction in leak current according to the aforementioned Patent Document 1, it is more effective to shield an active layer from backlight by use of a light shielding film or the like than to reduce the film thickness of the polycrystalline semiconductor thin film so as to control the effect.

SUMMARY OF THE INVENTION

An object of the present invention is to provide a polycrystalline semiconductor thin film grown laterally, in which crystal defects in crystal grains and small crystal grain boundary groups are reduced, and a polycrystalline semiconductor TFT having driving capacity high enough to form a high-performance integrated circuit by use of the polycrystalline semiconductor thin film. Another object of the present invention is to provide a method in which polycrystalline semiconductor thin films having different film qualities are formed together on one and the same glass substrate so that TFTs having different specifications are formed for pixel circuits and peripheral drive circuits respectively. A further object of the present invention is to provide an image display device manufactured by use of the method.

Of a precursor semiconductor layer, only a region where TFTs for forming high-performance circuits will be disposed is irradiated with a first energy beam so that crystal grains are grown laterally and made polycrystalline. Further, a second rapid thermal treatment is performed all over the surface of a glass substrate so as to reduce defects in the crystal grains in the region made polycrystalline by the irradiation with the energy beam, while making the precursor semiconductor layer polycrystalline in the other region so as to obtain a polycrystalline semiconductor thin film lower in quality than the polycrystalline region grown laterally.

TFTs formed in the low-quality polycrystalline region are low in on-current. However, the leak current in the TFTs is low due to high resistance, so that the withstand voltage can be increased. According to the manufacturing method of the present invention, high-performance circuit TFTs having properties of a high on-current, a low threshold value, a low variation and a steep rising edge, and TFTs having properties of a low leak current and a high withstand voltage can be formed on the same glass substrate. Thus, a high-quality image display device can be manufactured by use of this method.

According to the present invention, it is possible to obtain TFTs having higher performance than polycrystalline semiconductor TFTs obtained in the background-art laterally growing method, so that peripheral drive circuits having more functions than in the background art can be formed on one and the same glass substrate together with pixel circuits.

BRIEF DESCRIPTION OF THE DRAWINGS

FIG. 12 is a graph showing a relationship between the crystal grain size of a polycrystalline semiconductor film irradiated with an excimer laser beam and the energy density of the excimer laser beam;

DETAILED DESCRIPTION OF THE INVENTION

The best modes for carrying out the present invention will be described below in detail with reference to the drawings and in conjunction with embodiments.

First Embodiment

Figure 1A:
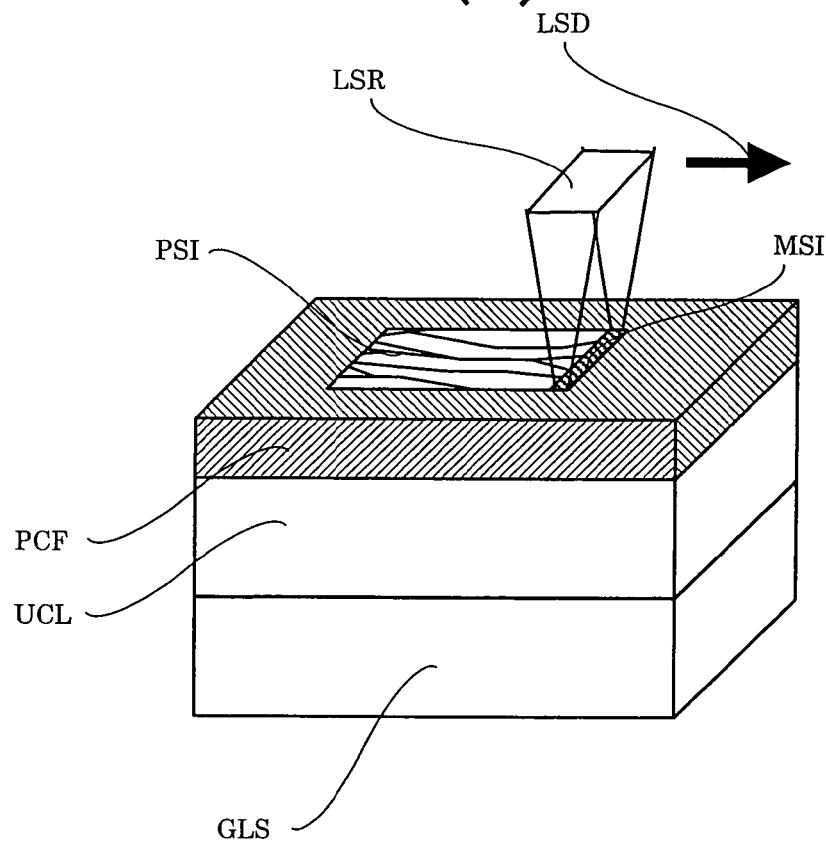
FIG. 1A is a conceptual view showing a state in which only a region where TFTs constituting a high-performance circuit will be disposed in a precursor semiconductor layer is irradiated with a first energy beam so as to be polycrystallized while growing crystal grains laterally.
Figure 1B:
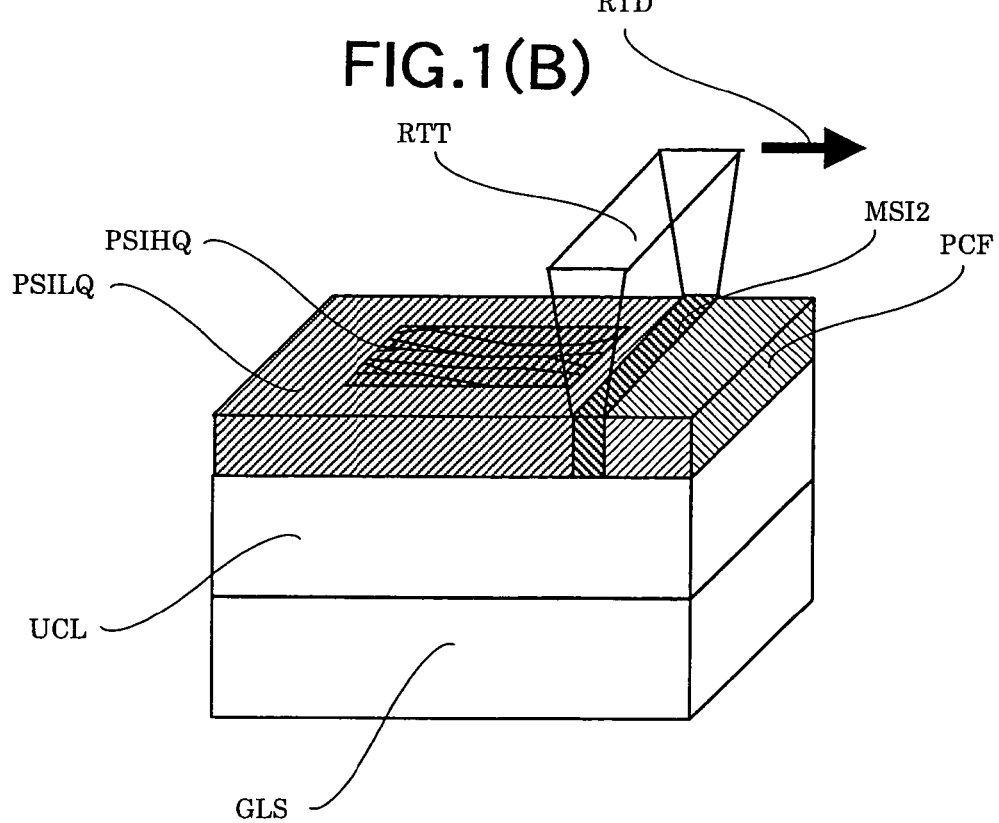
FIG. 1B is a conceptual view showing a method for further performing a second rapid thermal treatment upon the laterally grown and poly-crystallized region so as to obtain a high-quality polycrystalline semiconductor thin film in which defects in crystal grains have been reduced while simultaneously obtaining a low-quality polycrystalline semiconductor thin film capable of forming low-leak-current and high-withstand-voltage devices in the other region.

FIG. 1A is a conceptual view showing the concept that only a region where TFTs for forming a high performance circuit will be disposed in a precursor semiconductor layer is irradiated with a first energy beam so that crystal grains are made polycrystalline while being grown laterally. FIG. 1B is a conceptual view showing a method for performing a second rapid thermal treatment on the laterally grown and poly-crystallized region so as to obtain a high-quality polycrystalline semiconductor thin film in which defects in crystal gains have been reduced by performed, while simultaneously obtaining a low-quality polycrystalline semiconductor thin film which can form devices with a low leak current and a high withstand voltage in the other region.

As shown in FIG. 1A, an insulating film UCL serving as an undercoat is formed on a glass substrate GLS, and a precursor semiconductor film PCF is formed thereon. The precursor semiconductor film PCF may be an amorphous semiconductor film formed by CVD (Chemical Vapor Deposition), a film made polycrystalline by irradiating the whole surface of the amorphous semiconductor film with an excimer laser beam, or a polycrystalline semiconductor film produced in another method (for example, formed by CVD). The precursor semiconductor film PCF is irradiated with an energy beam (typically a laser beam) (in this embodiment, a laser beam is used) LSR. The beam is moved (scanned) in a crystal growing direction LSD so as to grow crystals in the scanning direction (laterally). Thus, a laterally grown polycrystalline semiconductor film PSI having a large crystal grain size in the laser scanning direction, having a uniform grain width and having a flat surface is produced.

Methods for obtaining the laterally grown polycrystalline semiconductor film PSI include a method in which a beam output from a solid or gas CW laser or a temporally pulsed beam of the beam output from the CW laser is scanned in the crystal growing direction LSD, and a method in which a position to be irradiated is irradiated with a beam from a light source for outputting energy, for example, from a pulse laser such as an excimer laser, for about several tens of nanoseconds in a plurality of stages while the output beam is shifted in the crystal growing direction LSD, so as to grow crystals in such a manner that polycrystals generated in a previous stage of irradiation are extended in the shifting direction LSD in the next stage.

In addition to these methods, thermal energy may be applied to a precursor semiconductor film doped with a catalyst metal such as Ni so as to obtain a laterally grown polycrystalline semiconductor film. Alternatively, the distribution of intensity of a pulsed beam from an excimer laser or the like may be modulated on a plane of a sample two-dimensionally, or the precursor semiconductor film or a sample structure lying thereunder may be devised to provide a thermal distribution in the crystal growing direction LSD on the precursor semiconductor film. Thus, a laterally grown polycrystalline semiconductor film can be obtained. Here, description will be made about an embodiment of the method in which a beam output from a solid or gas CW laser or a temporally pulsed beam of the beam output from the CW laser is scanned in the crystal growing direction.

In order to produce the laterally grown polycrystalline semiconductor film PSI, the conditions of irradiation with the energy beam LSR are important. The laterally growing speed to accelerate the growth of crystals in the scanning direction is about several meters per second. The beam width and the scanning speed of the energy beam are defined by the laterally growing speed. When the beam width of the energy beam is about 10 μm and the scanning speed is several hundreds of millimeters per second, the lateral growth is accelerated.

In this event, pay attention to one place in an irradiated region MSI. Then, it is supposed that the time when the energy beam will stay in the place will be several hundreds of nanoseconds to several hundreds of microseconds, and the melting time of the semiconductor layer will be substantially equal to the staying time of the energy beam. A semiconductor oxide film or a semiconductor nitride film formed by CVD is typically used as the insulating film UCL serving as an undercoat.

Next, as shown in FIG. 1B, a rapid thermal treatment RTT is performed on the laterally grown polycrystalline semiconductor film PSI and the precursor semiconductor film PCF so as to perform reduction of defects in crystal grains of the laterally grown polycrystalline semiconductor film PSI and poly-crystallization of the precursor semiconductor film PCF concurrently. Thus, a high-quality polycrystalline semiconductor film PSIHQ and a low-quality polycrystalline semiconductor film PSILQ are obtained. In this event, the rapid thermal treatment RTT may be performed in a method in which irradiation with an excimer laser beam is performed once or a plurality of times or in a RTA (Rapid Thermal Annealing) method, or by use of the same apparatus as the apparatus for generating the energy beam LSR.

There is no problem when the whole of the sample can be treated at a time in the rapid thermal treatment RTT. However, there may be a limit in the range of the treatment. In such a case, it will be go well if the rapid thermal treatment RTT is performed in a plurality of stages while shifting in a desired direction RTD as shown in FIG. 1B. In this event, the direction RTD does not have to be parallel to the direction LSD, but a desired direction may be selected as the direction RTD.

Figure 2A:
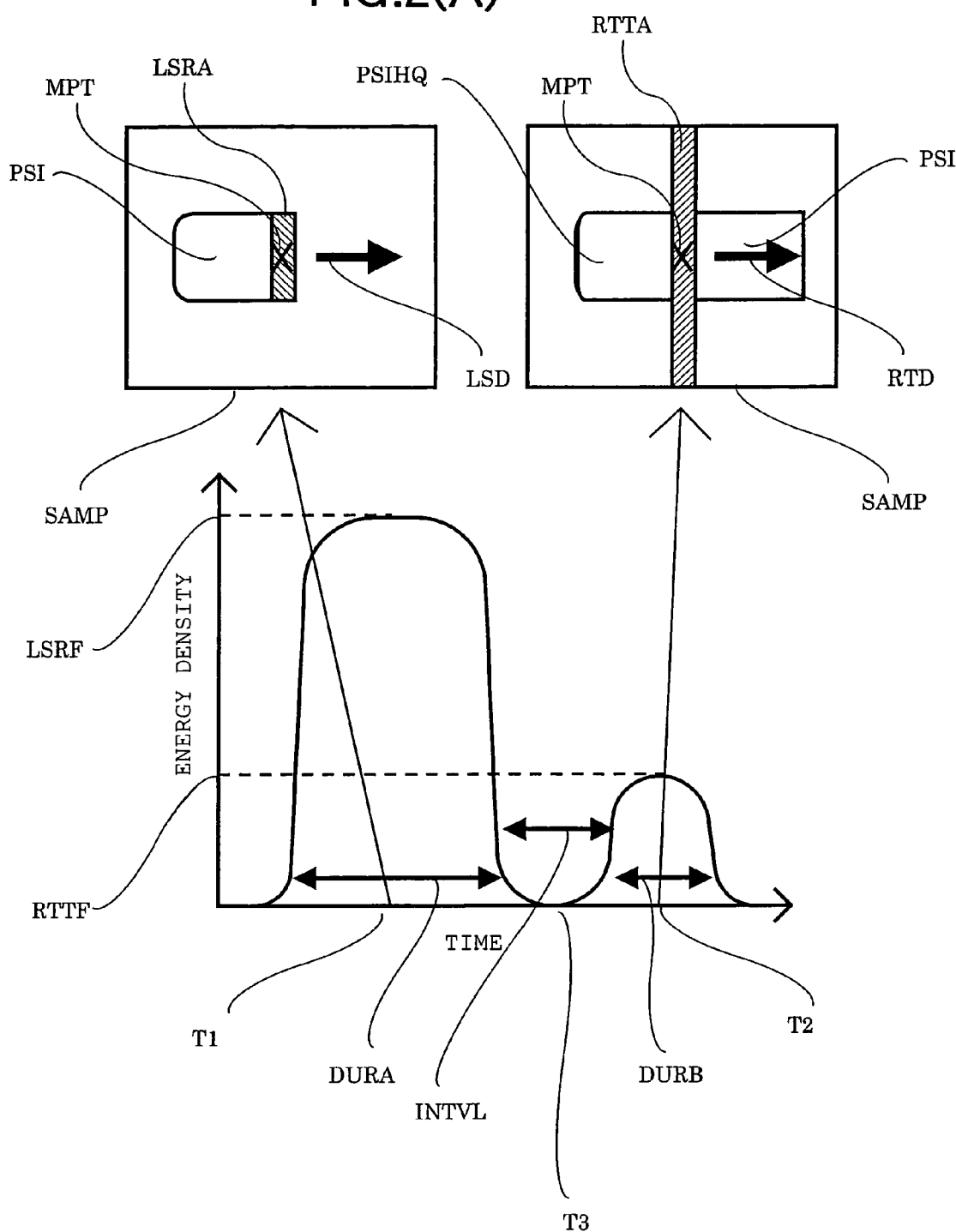
FIG. 2A is a schematic view showing a case where an output beam of a solid or gas CW laser or a (temporarily) pulsed beam of the output beam of the CW laser is used as a first energy beam LSR while a pulsed energy beam of an excimer laser or RTA is used for a second rapid thermal treatment RTT.
Figure 2B:
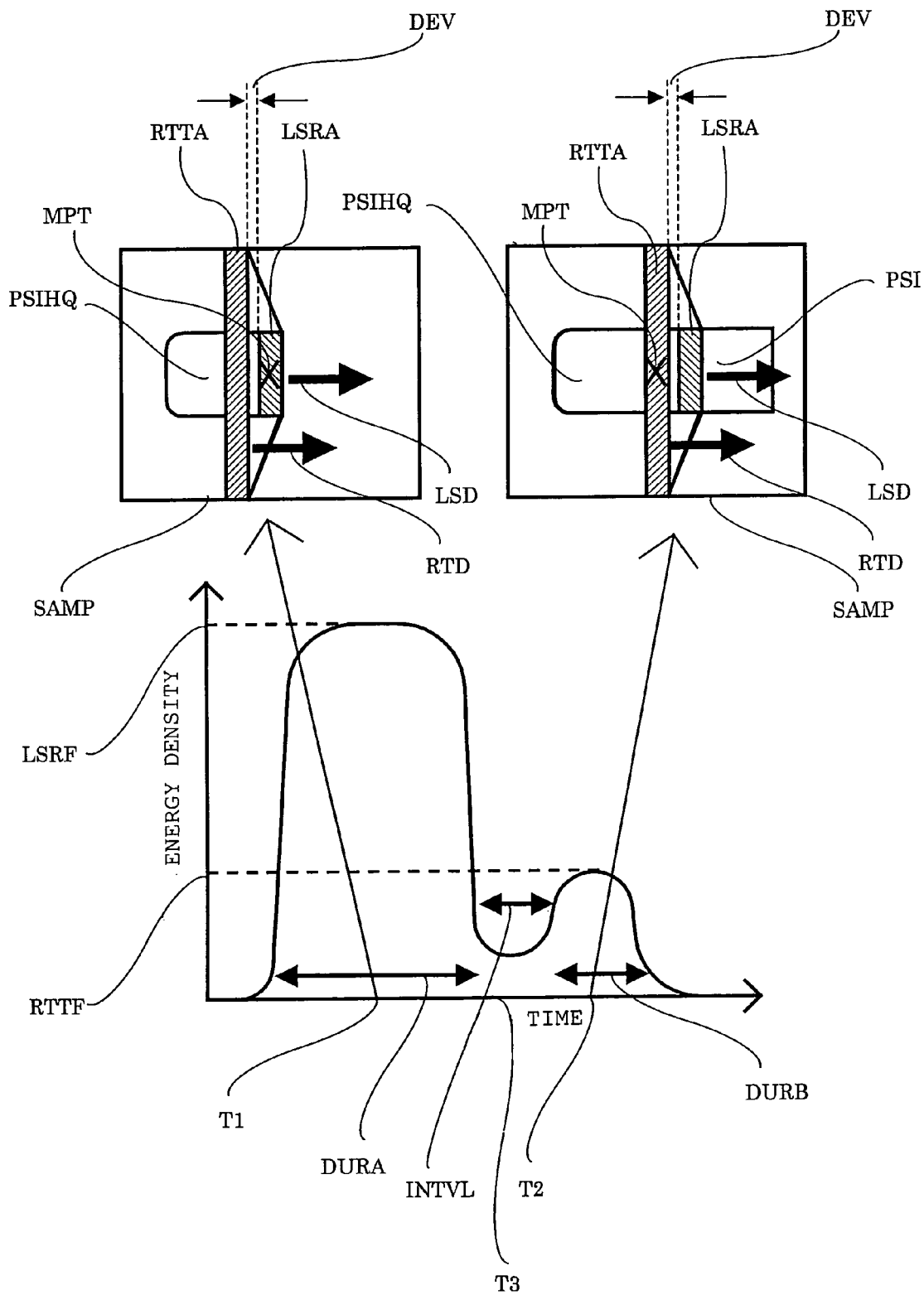
FIG. 2B is a view for explaining an example where the first energy beam LSR and the second rapid thermal treatment RTT are carried out by one and the same apparatus.
Figure 2C:
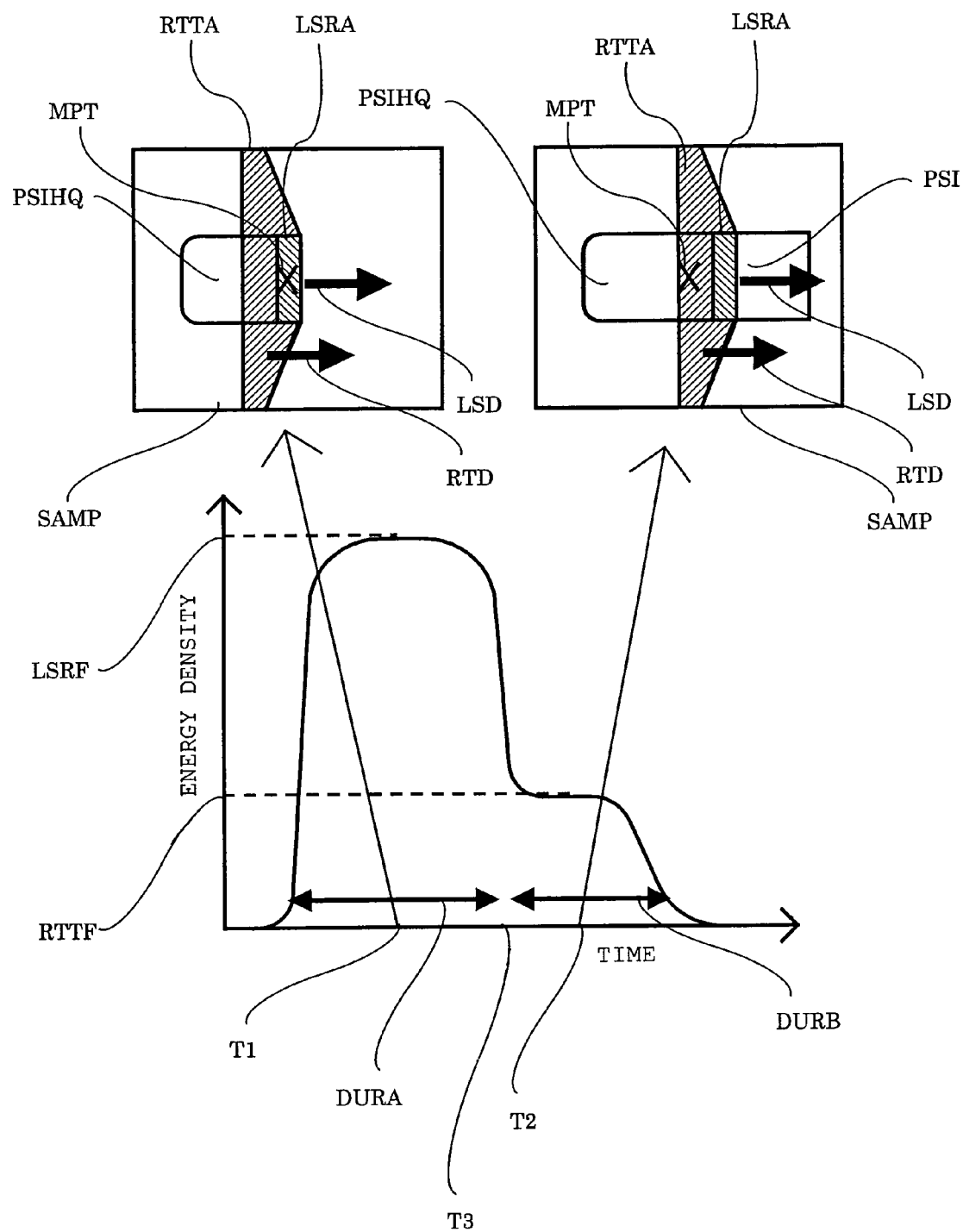
FIG. 2C is a view for explaining another example where the first energy beam LSR and the second rapid thermal treatment RTT are carried out by one and the same apparatus.

FIGS. 2A-2C are schematic views showing the variation per time of the energy density of the first energy beam, that of the second rapid thermal treatment, and the conditions of the sample. FIGS. 2A-2C include graphs showing the variation per time of the energy density of the first energy beam LSR and that of the second rapid thermal treatment RTT with respect to one point MPT on a semiconductor layer SAMP to which the method according to the first embodiment is applied. The left diagram inserted in the upper part of each graph shows the condition of the semiconductor layer SAMP near the point MPT at a time T1 when the first energy beam LSR passes the point MPT. The right diagram inserted in the upper part of each graph shows the condition of the semiconductor layer SAMP near the point MPT at a time T2 when the second rapid thermal treatment RTT passes the point MPT.

FIG. 2A is a schematic view showing a case where a beam output from a solid or gas CW laser or a temporally pulsed beam of the beam output from the CW laser is used as the first energy beam LSR, and a pulsed energy beam such as an excimer laser beam or RTA is used as the second rapid thermal treatment RTT. The staying time DURA of the first energy beam is just as described above. The treatment time DURB of the second rapid thermal treatment RTT depends on the method adopted. In the case of ELA, the treatment time DURB is several nanoseconds to several tens of nanoseconds.

There is no upper limit in an interval INTVL between the two thermal treatments if the interval INTVL is not smaller than 0 second. The semiconductor layer at the point MPT is in liquid phase at the time T1 and the time T2. The liquid phases at the time T1 and the time T2 are included in liquid phase regions LSRA and RTTA respectively. However, when the second rapid thermal treatment RTT is RTA, the region RTTA becomes a solid phase region. The phase of the semiconductor layer at the point MPT at a time T3 in the interval INTVL is a solid phase. The directions LSD and RTD do not have to be parallel, as described previously.

FIGS. 2B and 2C are explanatory views showing examples where the first energy beam LSR and the second rapid thermal treatment RTT are performed by use of one and the same apparatus. Also in this event, the variations per time of the energy densities in FIG. 2A can be reproduced if a control system and an optical system are devised. From the point of view of throughput or the like, it is however conceived that the examples of FIGS. 2B and 2C are preferred.

In these examples, one and the same beam is divided by an optical system so as to be spatially divided into the first energy beam LSR and an energy beam for the second rapid thermal treatment RTT, with which a sample SAMP is irradiated. In the same manner as in FIG. 2A, there is no upper limit in an interval INTVL between the two thermal treatments if the interval INTVL is not smaller than 0 second. The semiconductor layer at one point MPT is in liquid phase at a time T1 and a time T2. The liquid phases at the time T1 and the time T2 are included in liquid phase regions LSRA and RTTA respectively. When a spatially dividing distance DEV is large as in FIG. 2B, the phase of the semiconductor layer at the point MPT will be a solid phase at a time T3 in the interval INTVL. When the distance DEV is small as in FIG. 2C, the phase will be a liquid phase. The directions LSD and RTD do not have to be parallel, but in view from the system configuration, it is desired that the directions LSD and RTD are parallel.

In either example, the energy density RTTF of the rapid thermal treatment RTT is set to be lower than the energy density LSRF of the energy beam LSR. If the energy density of the rapid thermal treatment RTT is high, a semiconductor thin film MSI2 in the irradiated region will melt perfectly so that the laterally grown polycrystalline semiconductor film PSI will perfectly lose its crystal history made before the rapid thermal treatment RTT. Thus, the semiconductor thin film MSI2 will be a low-quality polycrystalline semiconductor film.

As for the optimum energy density in the rapid thermal treatment RTT, the conditions are set as follows. When an excimer laser or the same apparatus as the apparatus for generating the energy beam LSR is selected, the conditions are set so that at least the surface portion of the semiconductor thin film MSI2 in the region irradiated with the beam will melt due to the treatment. When RTA is selected, the conditions are set so that at least the surface portion of the semiconductor thin film MSI2 will be solid.

A method of repeating a known oxidization and film-formation step and a photo-lithography step may be used as the method for forming thin film transistors using the high-quality polycrystalline semiconductor film PSIHQ and the low-quality polycrystalline semiconductor film PSILQ described in FIG. 1A or 1B as active layers.

TFTs using the high-quality polycrystalline semiconductor film PSIHQ as their active layer have high-performance properties, and there is a small variation among the devices. It is therefore possible to use the TFTs for forming high-performance circuits. On the other hand, TFTs using the low-quality polycrystalline semiconductor film PSILQ as their active layer have high resistance so as to be low in leak current. Deterioration can be suppressed even if a high voltage is applied to such a TFT. It is therefore possible to use the TFTs for forming pixel circuits. According to the method of this embodiment, a system having more functions than in the background art can be constructed on one and the same glass substrate together with image circuits.

Figure 3:
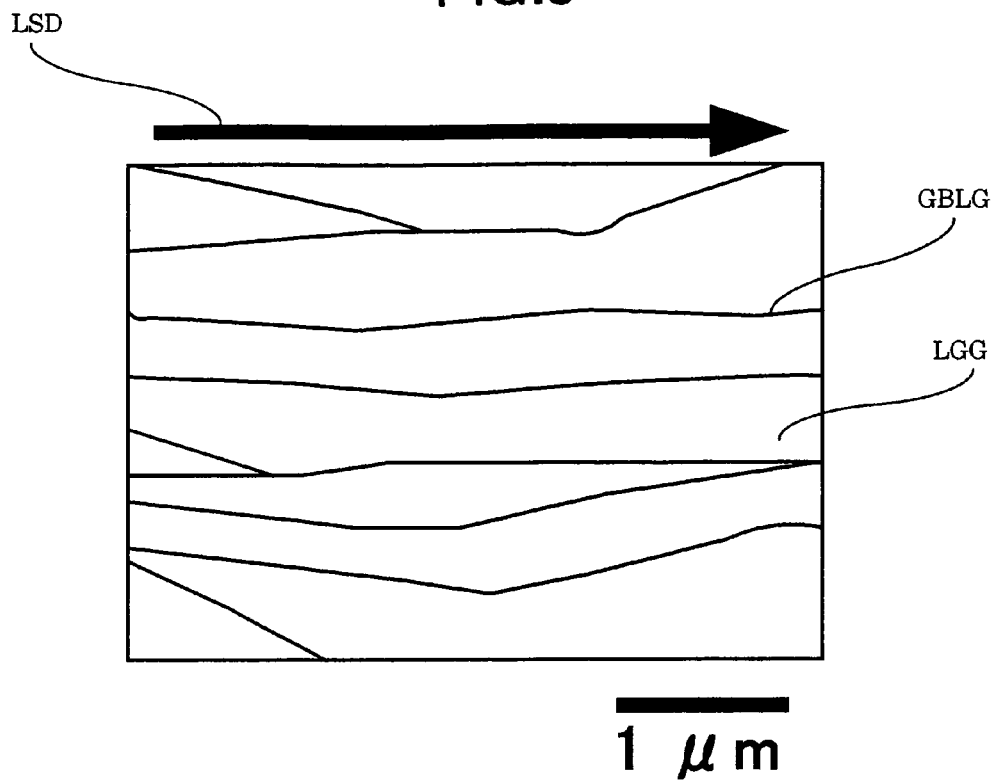
FIG. 3 is an explanatory view illustratively showing a scanning electron microscope image of a plane of a laterally grown polycrystalline semiconductor film.

FIG. 3 is an explanatory view illustratively showing a scanning electron microscope image of a plane of the laterally grown polycrystalline semiconductor film PSI when a long-time pulsed laser beam is selected as the energy beam LSR. The energy beam moves in the direction LSD on the sample surface relatively to the sample. In this event, the energy beam may be moved, or the sample may be moved in a direction opposite to the direction LSD. Crystal grain boundaries GBLG are formed to approach parallelism to the moving direction LSD of the energy beam.

The laterally grown polycrystalline semiconductor film PSI is characterized in that at least 60% thereof in area ratio is occupied by crystal grains LGG having a region free from crystal grain boundary 0.2 μm or more wide and 3 μm or more long. The crystal grain boundaries are substantially flat. From analysis by AFM (Atomic Force Microscope), it has been proved that the difference in height in the laterally grown polycrystalline semiconductor film PSI is not larger than 5 nm.

Figure 4:
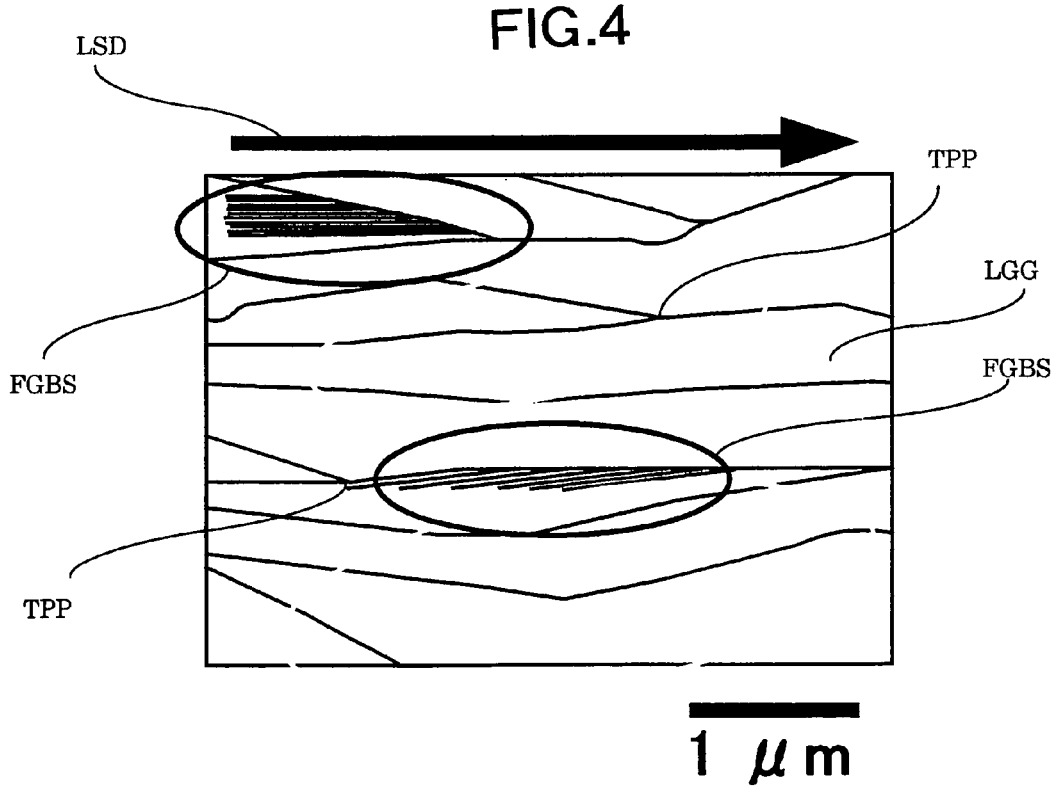
FIG. 4 is an explanatory view illustratively showing a scanning electron microscope image of a plane of the laterally grown polycrystalline semiconductor film including small crystal grain boundary groups.

FIG. 4 is an explanatory view illustratively showing a scanning electron microscope image of a plane of another region of the laterally grown polycrystalline semiconductor film PSI when a long-time pulsed laser beam is selected as the energy beam LSR in the same manner as in FIG. 3. Small crystal grain boundary groups FGBS each consisting of three or more crystal grain boundaries arranged substantially in parallel to one another and in an interval not larger than 100 nm from one another are distributed among large crystal grains LGG.

Figure 5:
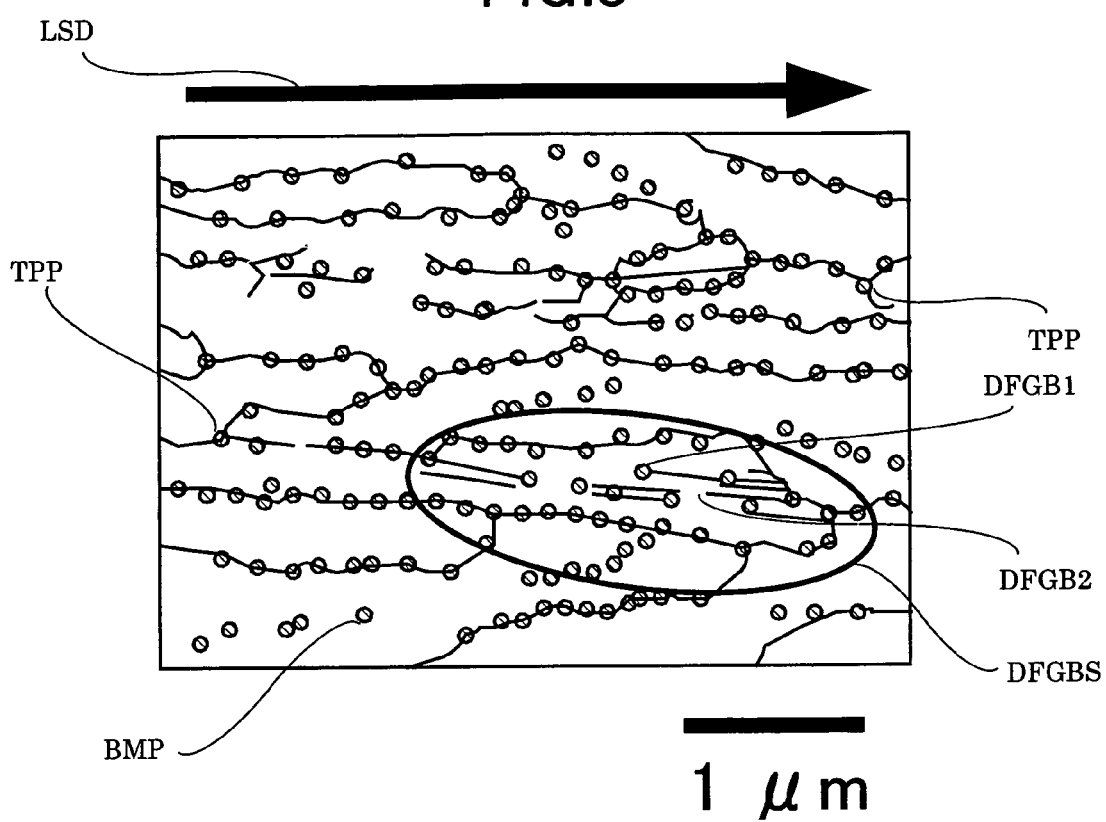
FIG. 5 is an explanatory view illustratively showing a scanning electron microscope image of a plane of a high-quality polycrystalline semiconductor film.

FIG. 5 is an explanatory view illustratively showing a scanning electron microscope image of a plane of the high-quality polycrystalline semiconductor film PSIHQ when irradiation with a low-energy-density excimer laser beam is selected as a method of rapid thermal treatment for reduction of defects in crystal grains of the laterally grown polycrystalline semiconductor film PSI and poly-crystallization of the precursor semiconductor film PCF. The small crystal grain boundary groups FGBS shown in FIG. 4 are reformed into small crystal grain boundary groups DFGBS as shown in FIG. 5. After the rapid thermal treatment, a large number of sites DFGB1 where linear boundaries disappear halfway or sites DFGB2 where the linear boundaries are disconnected intermittently are produced in each small crystal grain boundary group FGBS. This is because the small crystal grain boundary groups FGBS disappear due to the rapid thermal treatment. Thus, the crystallinity is improved.

Figure 6A:
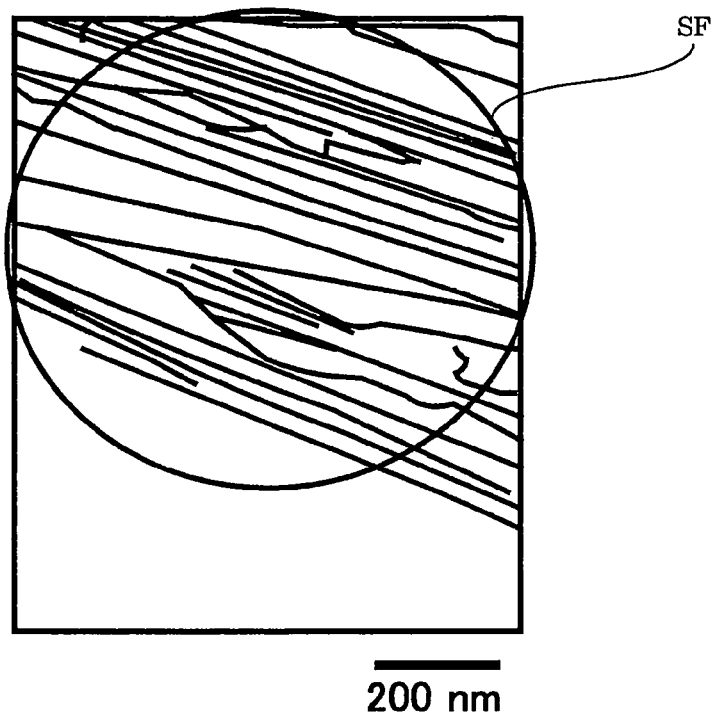
FIG. 6A is an explanatory view illustratively showing a transmission electron microscope image of a plane of a laterally grown polycrystalline semiconductor film PSI when a long-time pulsed laser beam is selected as the energy beam LSR in the same manner as in FIG. 3.
Figure 6B:
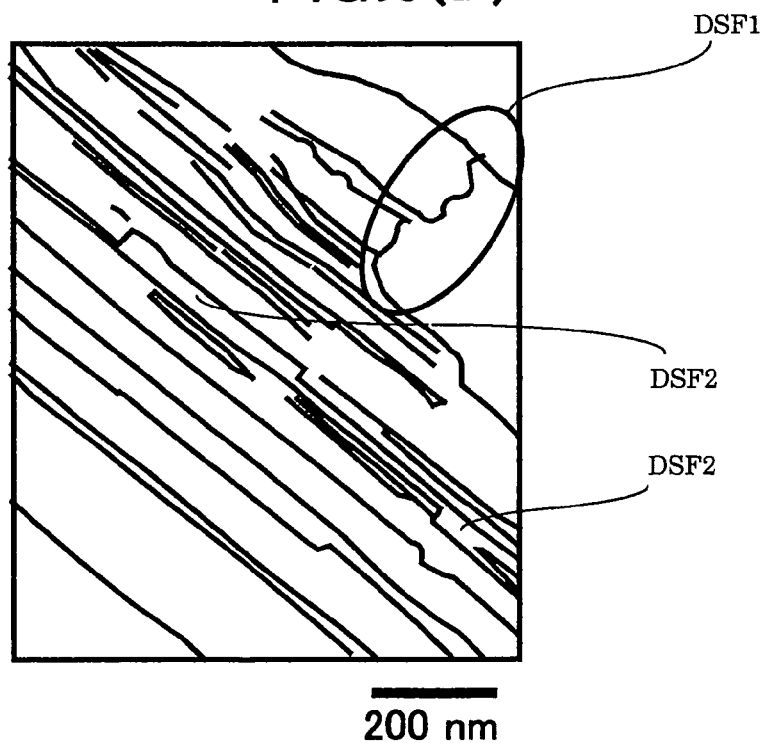
FIG. 6B is an explanatory view illustratively showing a transmission electron microscope image of a plane of a high-quality polycrystalline semiconductor film PSIHQ when irradiation with a low-energy-density excimer laser beam is selected as a method of the rapid thermal treatment in the same manner as in FIG. 5.

FIG. 6A is an explanatory view illustratively showing a transmission electron microscope image of a plane of the laterally grown polycrystalline semiconductor film PSI when a long-time pulsed laser beam is selected as the energy beam LSR in the same manner as in FIG. 3. FIG. 6B is an explanatory view illustratively showing a transmission electron microscope image of a plane of the high-quality polycrystalline semiconductor film PSIHQ when irradiation with a low-energy-density excimer laser beam is selected as a method of the rapid thermal treatment in the same manner as in FIG. 5.

In the crystal grains of the laterally grown polycrystalline semiconductor film PSI, there are transcrystalline defects such as dislocations, twins, vacancies, etc. as well as stacking defects SF. When the laterally grown polycrystalline semiconductor film PSI is irradiated with a low-energy-density excimer laser beam, the stacking defects SF disappear like the regions DSF1 or are disconnected like the regions DSF2 so that the crystallinity is improved. The number density of the other transcrystalline defects is also reduced by the irradiation with the low-energy-density excimer laser beam, so that the crystallinity is improved.

Figure 7:
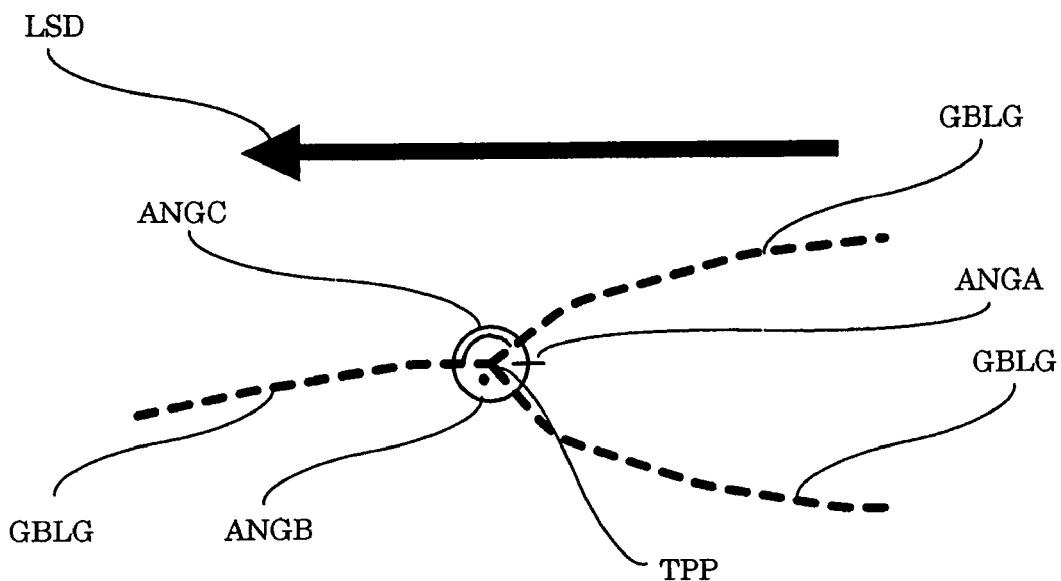
FIG. 7 is a conceptual view showing definitions of a triple point and three angles of the triple point.

FIG. 7 is a conceptual view showing definitions of a triple point and three angles of the triple point. In the laterally grown polycrystalline semiconductor film PSI described in FIG. 4 and the high-quality polycrystalline semiconductor film PSIHQ described in FIG. 5, there are a large number of points (triple points) TPP where three crystal grain boundaries GBLG intersect. As shown in FIG. 7, pay attention to three angles ANGA, ANGB and ANGC between two adjacent crystal grain boundaries GBLG in each triple point. In the laterally grown polycrystalline semiconductor film PSI, the upstream angle ANGA of all the triple angles with respect to the beam scanning direction LSD is an acute angle not smaller than 70% and not larger than 90°. On the other hand, in the high-quality polycrystalline semiconductor film PSIHQ, many triple points have obtuse angles of 90° or more in all the three angles ANGA, ANGB and ANGC. Of all the triple points, 60% or more correspond to this case.

The high-quality polycrystalline semiconductor film PSIHQ in FIG. 5 is also characterized in that there are a large number of protruding structures (hereinafter referred to as protrusions) BMP on the surface thereof. The protrusions depend on the irradiation conditions of the excimer laser beam. Under the optimum conditions to improve the crystallinity of the laterally grown polycrystalline semiconductor film PSI, 80% or more of distances among the protrusions are not shorter than 0.10 μm and not longer than 0.80 μm. The density thereof ranges from 5 to 20 pieces/μm$^2$. From the AFM analysis, it has been proved that 70% or more of peak-to-valley heights of the protrusions range from 2 nm to 50 nm.

Figure 8:
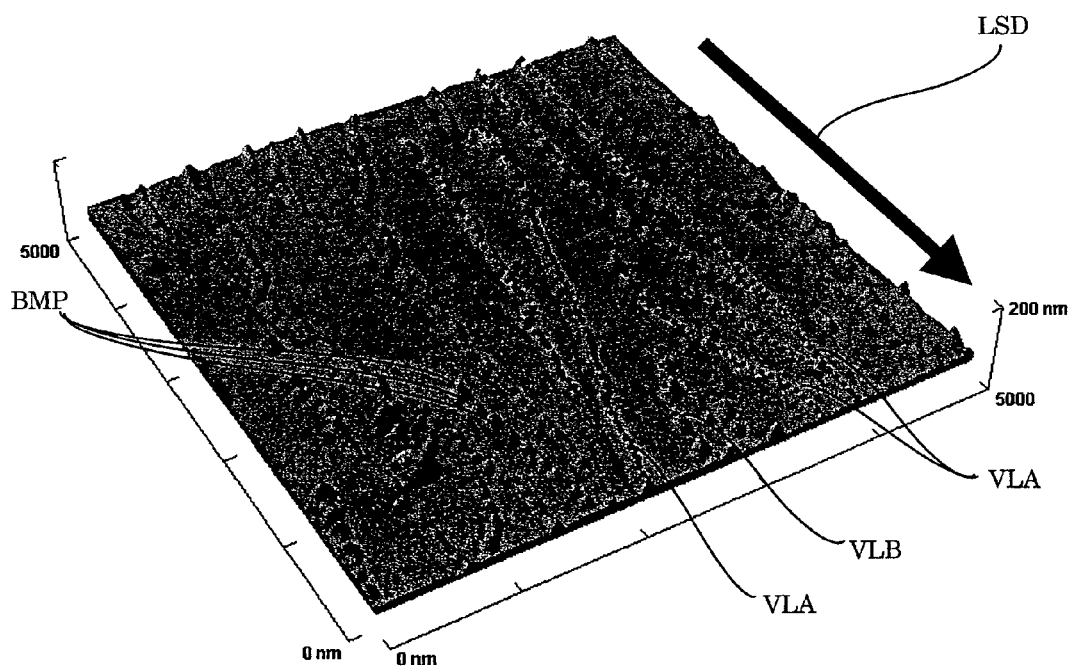
FIG. 8 is a bird's-eye view in which a result of analysis of a surface of the high-quality polycrystalline semiconductor film by AFM is visualized.

FIG. 8 is a bird's-eye view in which irregularities in the surface of the high-quality polycrystalline semiconductor film PSIHQ are analyzed by AFM, and the result of the analysis are visualized. In FIG. 8, pay attention to one protrusion, and draw a line connecting the protrusion with adjacent two protrusions. When the protrusion to pay attention to is changed and the line drawing is repeated, it is understood that the protrusions BMP are aligned on virtual lines VLA and VLB running substantially in parallel with the beam scanning direction LSD. Though the distance between the virtual lines depends on the irradiation conditions of the excimer laser beam, the virtual lines are arranged at an interval not shorter than 0.10 μm and not longer than 0.80 μm. There is a backbone-like rise on the virtual line VLA, but there is no rise on the virtual line VLB. From the sectional analysis with the transmission electron microscope image, there are crystal grain boundaries on some virtual lines, but there is no crystal grain boundary on the other virtual lines.

Figure 9:
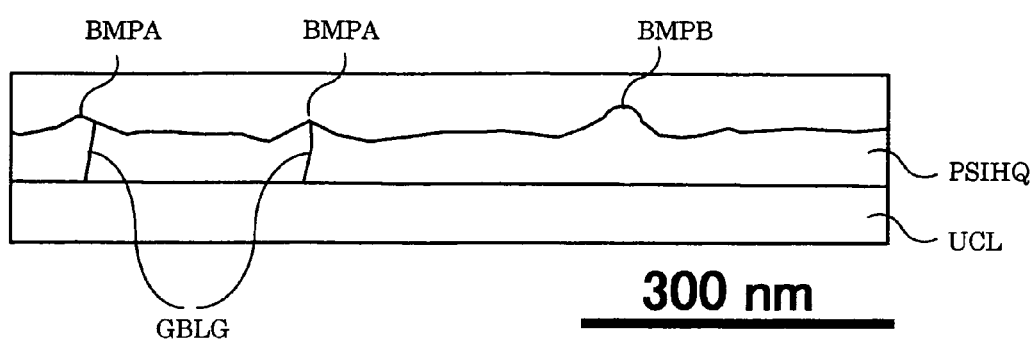
FIG. 9 is an explanatory view illustratively showing a transmission electron microscope image of a cut plane of the high-quality polycrystalline semiconductor film perpendicular to the laterally growing direction.

FIG. 9 is an explanatory view illustratively showing a transmission electron microscope image of a section of the high-quality polycrystalline semiconductor film PSIHQ. FIG. 9 corresponds to a section where the sample is cut perpendicularly to the beam scanning direction LSD in FIG. 5 or 8. In FIG. 9, there is a crystal grain boundary GBLG in each protrusion BMPA, but there is no crystal grain boundary in each protrusion BMPB.

Figure 10:
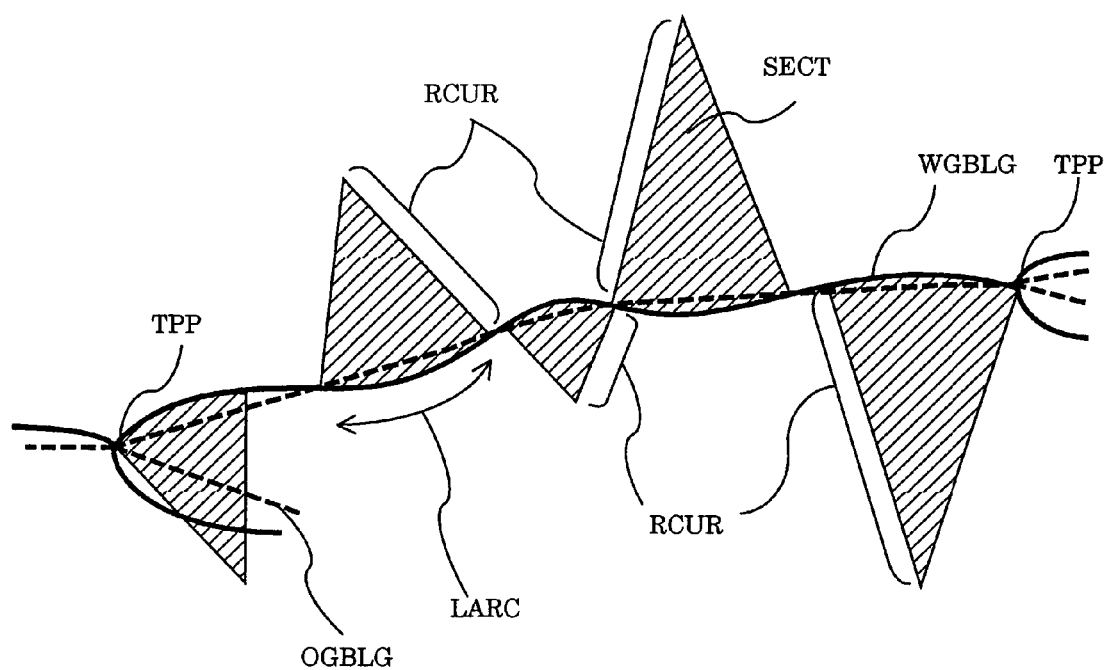
FIG. 10 is a conceptual view of a crystal grain boundary having windings.

FIG. 10 is a schematic view of a crystal grain boundary having windings. Compare a crystal grain boundary GBLG of the laterally grown polycrystalline semiconductor film PSI in FIG. 4 with a crystal grain boundary GBLG of the high-quality polycrystalline semiconductor film PSIHQ in FIG. 5. It is understood that the crystal grain boundary WGBLG of the latter has windings between two triple points TPP as shown in the schematic view of FIG. 10. From the analysis of the scanning electron microscope image of the plane, the crystal grain boundary WGBLG having windings is composed of a set of curves whose arc lengths LARC are not longer than 1 μm and whose curvature radii RCUR are not longer than 20 μm. The reference sign SECT in FIG. 10 designates a sector using each constituent curve as its arc and having a curvature radius equal to that of the constituent curve.

The reason why all the three angles ANGA, ANGB and ANGC of each triple point are obtuse angles not smaller than 90° and the reason why the protrusions BMPB having no crystal grain boundary or the crystal grain boundaries WGBLG having windings are formed are estimated as follows.

That is, through the rapid thermal treatment based on irradiation with an excimer laser beam with low energy density, the laterally grown polycrystalline semiconductor film PSI is once melted so that atoms constituting the semiconductor thin film are rearranged. In this event, defects in crystal grains are reduced, while unmelted crystal grains forming the laterally grown polycrystalline semiconductor film PSI serve as nuclei so that crystal grains grow again. Crystal grains derived from one and the same crystal grain collide with each other so as to form a backbone-like rise or a protrusion. However, the orientations of the crystal grains are equal to each other. Thus, the crystal grains are merged without forming any gain boundary. Crystal grains grown from crystal nuclei derived from different crystal grains form not only a backbone-like rise or a protrusion but also a crystal grain boundary due to a large difference in crystal orientation therebetween. (Of them, crystal grains having orientations close to each other are merged.)

Near each triple point, crystal grains growing from crystal nuclei derived from three different crystal grains collide with one another so as to form the triple point. Since the crystal grains growing isotropically collide with one another, all the three angles ANGA, ANGB and ANGC of the triple point tend to form angles close to 120°. Each crystal grain boundary is located in a position where crystal grains growing from crystal nuclei derived from two different crystal grains collide with each other. The crystal grain boundary depends on the positions of crystal nuclei where they are crystallized again, but the positions of the crystal nuclei are random. As a result, it is conceived that the crystal boundary has windings.

Thus, the high-quality polycrystalline semiconductor film PSIHQ is characterized in that crystals have been reformed through the rapid thermal treatment without losing the history of good crystal grains of the laterally grown polycrystalline semiconductor film PSI.

Of crystal orientations normal to the film surface of the high-quality polycrystalline semiconductor film PSIHQ obtained by EBSD (Electron Back Scattered Diffraction) analysis and electron diffraction analysis using a transmission electron microscope, each of the orientations [110] and [100] occupies an area ratio of 20% or higher, and the are ratio of the orientation [110] is higher than that of the orientation [100]. There is no orientation whose area ratio exceeds 50%. On the other hand, the area ratio of the orientation [111] is not higher than 10%.

As for crystal orientations in the crystal growing direction when the high-quality polycrystalline semiconductor film PSIHQ grows laterally, crystal grains of the orientation [100] are included with an area ratio of 30% or higher. The ratio of the crystal grains of the orientation [100] is higher than that of any of the other two crystal orientations. However, there is no crystal orientation whose area ratio exceeds 70%.

As for crystal orientations in the minor axis direction of crystal grains of the high-quality polycrystalline semiconductor film PSIHQ, that is, crystal orientations perpendicular to the growing direction of crystals when the crystals grow laterally, and parallel to the film surface, crystal grains of the orientation [110] are included with an area ratio of 25% or higher. The ratio of the crystal grains of the orientation [110] is higher than that of any of the other two crystal orientations. However, the area ratio does not exceed 50%. Each area ratio of the other two crystal orientations does not exceed 30%.

These results are substantially equivalent to the results of the laterally grown polycrystalline semiconductor film PSI which has not been subjected to the rapid thermal treatment. That is, there is no big change in crystal orientations between before and after the rapid thermal treatment, but the history of crystals of the laterally grown polycrystalline semiconductor film PSI survives in the high-quality polycrystalline semiconductor film PSIHQ. Each crystal orientation is mentioned here as the total sum of areas occupied by grains which can be regarded as identical because their orientations are within ±20° from a reference direction of the crystal orientation.

Figure 11:
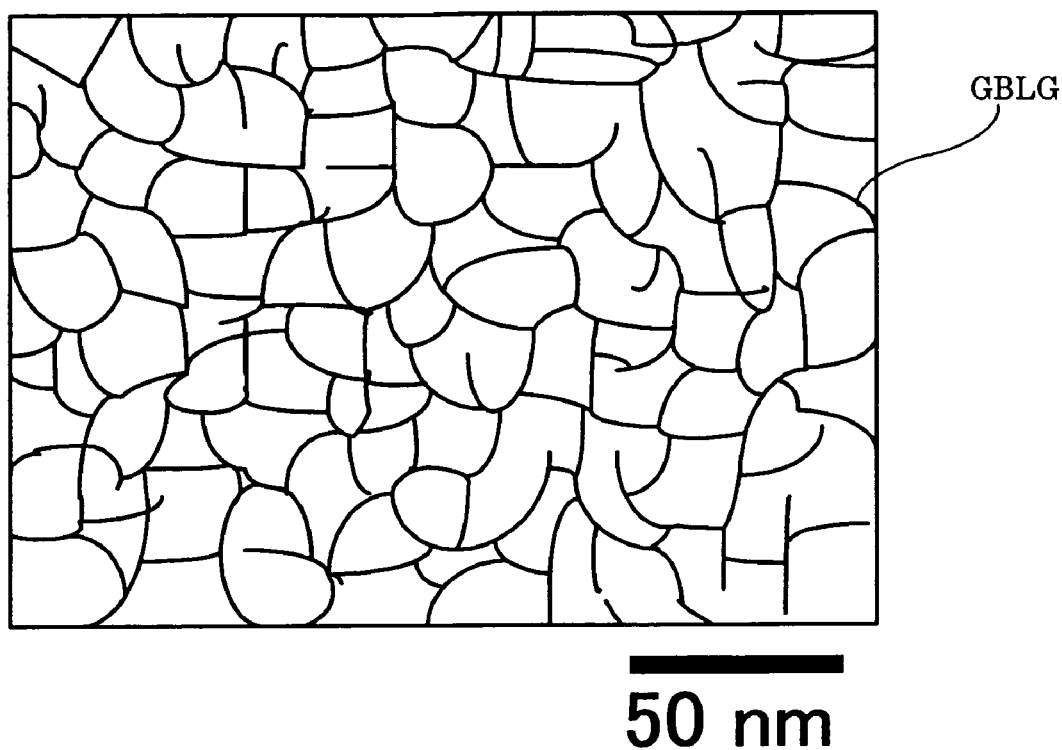
FIG. 11 is an explanatory view illustratively showing a scanning electron microscope image of a plane of a low-quality polycrystalline semiconductor film.

FIG. 11 is an explanatory view illustratively showing a scanning electron microscope image of a surface of the low-quality polycrystalline semiconductor film PSILQ obtained by poly-crystallization of the precursor semiconductor film PCF when irradiation with a low-energy-density excimer laser beam is selected as the method of the rapid thermal treatment. Crystal grains forming the low-quality polycrystalline semiconductor film PSILQ have a small grain size of about 20 nm. Thus, a high-resistance polycrystalline semiconductor film can be obtained.

FIG. 12 is a graph showing a qualitative relationship between the grain size of crystal grains and the energy density of the excimer laser. When an excimer laser is used for poly-crystallization of a silicon film, the grain size of crystal grains depends on the energy density. The scales of axes depend on the film thickness and the kind of a light source. Therefore, the scales are set by given units. With increase in energy density EF, the crystal grain size RG increases gradually. As the energy density approaches one energy density EFMAX, the crystal grain size RG increases sharply. After the crystal grain size RG reaches a maximum value RGMAX at the energy density EFMAX, the crystal grain size RG decreases sharply.

Figure 13A:
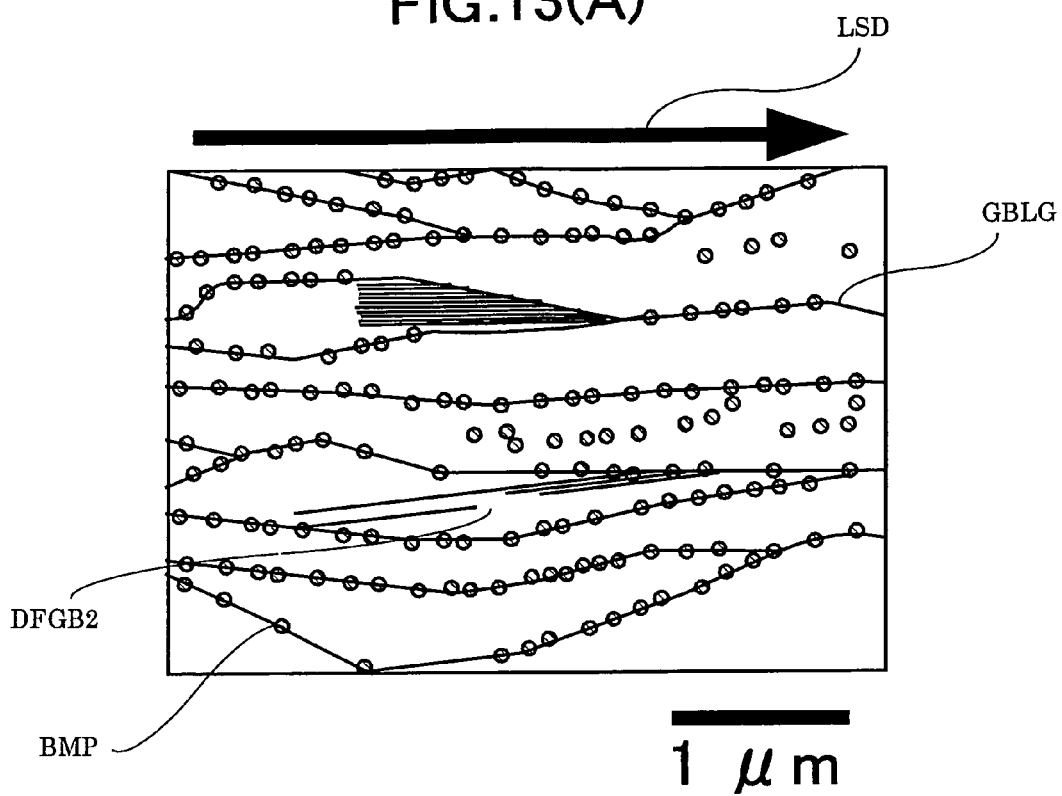
FIG. 13A is a view for explaining a region which has been a laterally grown polycrystalline semiconductor film PSI.
Figure 13B:
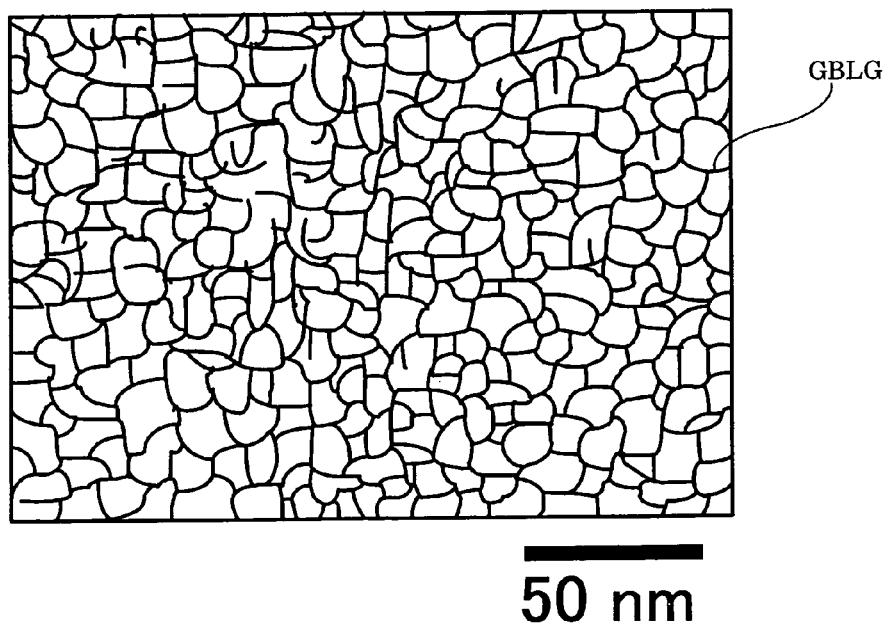
FIG. 13B is an explanatory view illustratively showing a surface scanning electron microscope image of a surface of a low-quality polycrystalline semiconductor film PSILQ.

When irradiation with a low-energy-density excimer laser beam is selected as the method of the rapid thermal treatment, there is an optimum energy density range EFMOD. FIGS. 13A and 13B are views illustratively showing scanning electron microscope images of a plane of a polycrystalline semiconductor film irradiated with energy density EFUF lower than the optimum energy density range EFMOD in FIG. 12. FIG. 13A is an explanatory view illustratively showing a surface scanning electron microscope image of the surface of a region which has served as the laterally grown polycrystalline semiconductor film PSI. FIG. 13B is an explanatory view illustratively showing a surface scanning electron microscope image of the surface of the low-quality polycrystalline semiconductor film PSILQ. After the rapid thermal treatment, occurrence or disappearance of intermittently disconnected sites DFGB2 can be confirmed in a small crystal grain boundary group. Thus, the crystallinity is improved, but the frequency of the improvement is low and the effect thereof is low. The crystal grain size in the low-quality polycrystalline semiconductor film PSILQ is not larger than 10 nm.

Figure 14A:
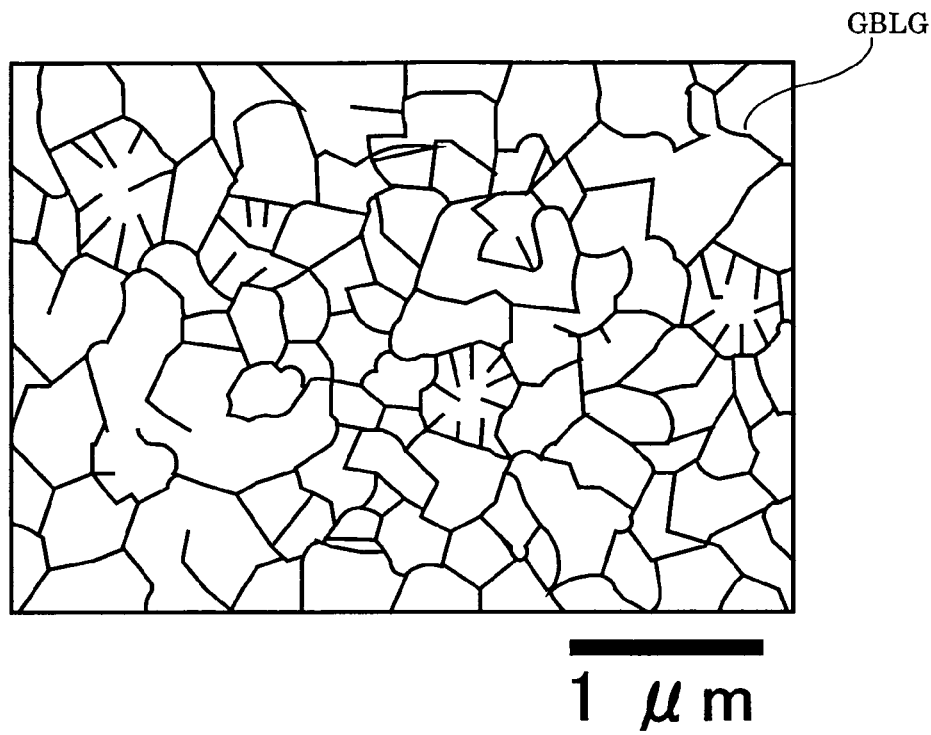
FIG. 14A is a view for explaining a region which has been a laterally grown polycrystalline semiconductor film PSI.
Figure 14B:
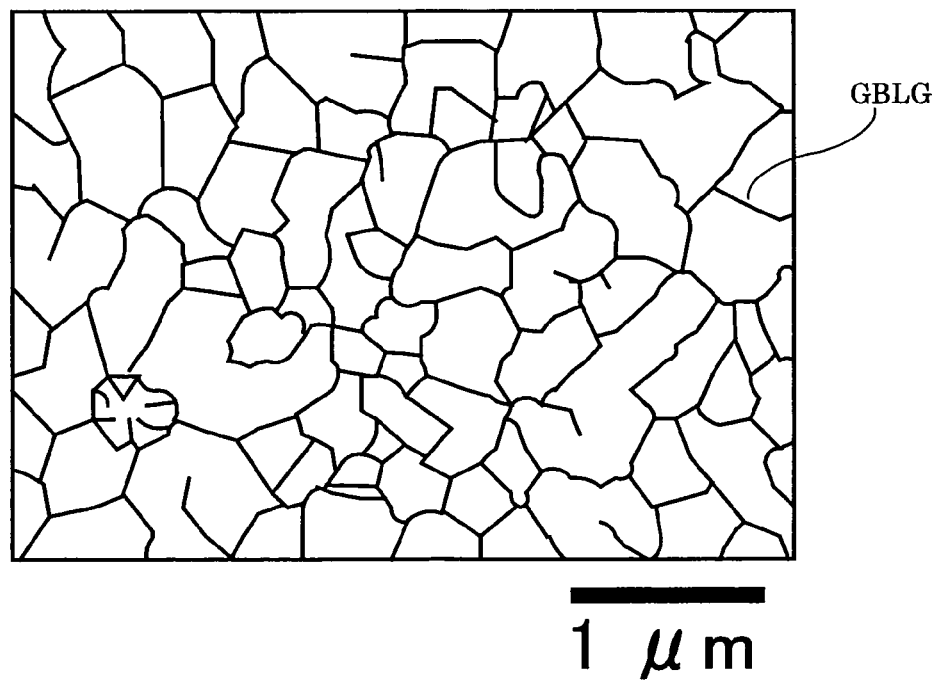
FIG. 14B is a view for explaining a region of the low-quality polycrystalline semiconductor film PSILQ.

FIGS. 14A and 14B are explanatory views illustratively showing scanning electron microscope images of a plane of a polycrystalline semiconductor film irradiated with energy density EFOF higher than the optimum energy density range EFMOD in FIG. 12. FIG. 14A is an explanatory view illustratively showing a scanning electron microscope image of the plane of a region which has served as the laterally grown polycrystalline semiconductor film PSI. FIG. 14B is an explanatory view illustratively showing a scanning electron microscope image of the plane of a region serving as the low-quality polycrystalline semiconductor film PSILQ.

It is understood from FIG. 14A that the history of crystal grains of the laterally grown polycrystalline semiconductor film PSI has been deleted perfectly under the irradiation conditions. That is, the crystallinity is not improved at all, but the quality thereof deteriorates. From FIG. 14B, the crystal grain size in the low-quality polycrystalline semiconductor film PSILQ is not smaller than 0.3 μm. When TFTs are produced out of this film, the field effect mobility is not lower than 100 cm$^2$/Vs. The TFT characteristic is improved, but the resistance of the film becomes so low that the leak current increases.

The optimum energy density EFMOD shown in FIG. 12 depends on the film thickness and the kind of the light source. The optimum energy density EFMOD may be substantially set so that the low-quality polycrystalline semiconductor film PSILQ will have a surface shape similar to that in FIG. 11. That is, when irradiation with a low-energy-density excimer laser beam is selected as the method of the rapid thermal treatment, the energy density is selected so that the low-quality polycrystalline semiconductor film PSILQ will have a crystal grain size of about 10 nm to 100 nm. When irradiation with the excimer laser beam is selected with such an energy density, the high-quality polycrystalline semiconductor film PSIHQ and the low-quality polycrystalline semiconductor film PSILQ can be produced simultaneously and most efficiently.

Assume that irradiation with a long-time pulsed laser beam is selected as the irradiation with the energy beam LSR while irradiation with a low-energy-density excimer laser beam is selected as the method of the rapid thermal treatment for reducing defects in crystal grains of the laterally grown polycrystalline semiconductor film PSI and poly-crystallizing the precursor semiconductor film PCF. In this case, the field effect mobility of N-type TFTs produced out of the high-quality polycrystalline semiconductor film PSIHQ depends on the existence of termination processing of crystal grain boundaries and the method for processing of the interface between the gate insulating film and the low-quality polycrystalline semiconductor film PSILQ. The average value of the mobility reaches 300 cm$^2$/Vs or higher. On the other hand, the field effect mobility of N-type TFTs produced out of the low-quality polycrystalline semiconductor film PSILQ depends on the existence of termination processing of crystal grain boundaries and the method for processing of the interface between the gate insulating film and the low-quality polycrystalline semiconductor film PSILQ. The average value of the mobility ranges from 1 cm$^2$/Vs to 100 cm$^2$/Vs.

Assume that a beam other than the long-time pulsed laser beam is selected as the energy beam LSR while irradiation with a low-energy-density excimer laser beam is selected as the method of the rapid thermal treatment for reducing defects in crystal grains of the laterally grown polycrystalline semiconductor film PSI and poly-crystallizing the precursor semiconductor film PCF. In this case, the high-quality polycrystalline semiconductor film PSIHQ formed also has a similar surface shape.

When irradiation with a low-energy-density excimer laser beam is selected as the method of the rapid thermal treatment for reducing defects in crystal grains of the laterally grown polycrystalline semiconductor film PSI and poly-crystallizing the precursor semiconductor film PCF, the surface shape of the low-quality polycrystalline semiconductor film PSILQ depends on the precursor semiconductor film PCF. When the precursor semiconductor film PCF is an amorphous semiconductor film or a polycrystalline semiconductor film composed of small-crystal-size crystal grains produced in another method (e.g. formed into a film by CVD), the low-quality polycrystalline semiconductor film PSILQ has a surface shape similar to that shown in FIG. 11. When the precursor semiconductor film PCF is a film poly-crystallized by irradiation all over an amorphous semiconductor film with an excimer laser beam, the low-quality polycrystalline semiconductor film PSILQ has a surface shape where the history of the surface shape of the precursor semiconductor film PCF survives.

When RTA is selected as the method of the rapid thermal treatment for reducing defects in crystal grains of the laterally grown polycrystalline semiconductor film PSI and poly-crystallizing the precursor semiconductor film PCF, the laterally grown polycrystalline semiconductor film PSI is reformed under the solid phase due to a problem of the heat resistance of the insulating substrate. In this case, there is little difference between the surface shape of the high-quality polycrystalline semiconductor film PSIHQ and the surface shape of the laterally grown polycrystalline semiconductor film PSI, but defects in crystal grains are reduced.

The features of the semiconductor thin films according to the present invention described above can be summarized as follows. (1) A region occupying at least 60% of a semiconductor thin film in area ratio is composed of crystal grains with a region free from crystal grain boundaries 0.2 μm or more wide and 3 μm or more long, while small crystal grain boundary groups each composed of three or more crystal grain boundaries arranged substantially in parallel and at intervals of 100 nm or less are included in parts of the region, and the small crystal grain boundary groups disappear partially.

(2) A major part of a semiconductor thin film is composed of crystal grains with a region free from crystal grain boundaries 0.2 μm or more wide and 3 μm or more long, while in most of points where three crystal grain boundaries cross one another, all of the three angles formed between two of the three crystal grain boundaries are not smaller than 90°.

(3) A region occupying at least 60% of a semiconductor thin film in area ratio is composed of crystal grains with a region free from crystal grain boundaries 0.2 μm or more wide and 3 μm or more long, while in at least 60% of points where three crystal grain boundaries cross one another, all of the three angles formed between two of the three crystal grain boundaries are not smaller than 90°.

(4) A major part of a semiconductor thin film is composed of crystal grains with a region free from crystal grain boundaries 0.2 μm or more wide and 3 μm or more long, while a plurality of protrusions are disposed on the surface of the polycrystalline semiconductor film.

(5) A region occupying at least 60% of a semiconductor thin film in area ratio is composed of crystal grains with a region free from crystal grain boundaries 0.2 μm or more wide and 3 μm or more long, while a plurality of protrusions are disposed on the surface of the polycrystalline semiconductor film.

(6) In the paragraph (5), the intervals between adjacent two of the protrusions are not shorter than 0.10 μm and not longer than 0.80 μm.

(7) In the paragraph (5), at least 80% of the intervals between adjacent two of the protrusions are not shorter than 0.10 µm and not longer than 0.80 µm.

(8) In the paragraph (5), the density of the protrusions is not lower than 5 pieces/µm$^2$ and not higher than 20 pieces/µm$^2$.

(9) In the paragraph (5), the protrusions are distributed on virtual lines extending in one and the same direction.

(10) In the paragraph (9), the distance between the virtual lines is not shorter than 0.10 µm.

(11) In the paragraph (9), the distance between the virtual lines is not shorter than 0.10 µm and not longer than 0.80 µm.

(12) In the paragraph (5), groups of the protrusions formed on crystal grain boundaries and groups of the protrusions formed in regions where there is no crystal grain boundary are mixed.

(13) In the paragraph (5), the average value of the difference in height in the film is not smaller than 2 nm and not larger than 50 nm.

(14) In a polycrystalline semiconductor film whose major part is composed of crystal grains with a region free from crystal grain boundaries 0.2 µm or more wide and 3 µm or more long, each grain boundary connecting adjacent points where three crystal grain boundaries cross one another has windings.

(15) In a polycrystalline semiconductor film whose major part is composed of crystal grains with a region free from crystal grain boundaries 0.2 µm or more wide and 3 µm or more long, each grain boundary connecting adjacent points where three crystal grain boundaries cross one another has windings each composed of a set of curves having an arc length of 1 µm or less and a curvature radius of 20 µm or less.

(16) In any one of the paragraphs (6) through (15), crystal grains with a crystal orientation [110] normal to the film surface of the polycrystalline semiconductor film are included with an area ratio of 20% or higher, and crystal grains with a crystal orientation [100] likewise are included with an area ratio of 20% or higher.

(17) In the paragraph (16), crystal grains with a crystal orientation [111] normal to the film surface are included with an area ratio of 10% or lower.

(18) In any one of the paragraphs (6) through (15), crystal grains with crystal orientations [110], [100] and [111] normal to the film surface of the polycrystalline semiconductor film are included, and the ratio of the area occupied by the crystal grains with each crystal orientation is not higher than 50%.

(19) In any one of the paragraphs (6) through (15), crystal grains with a crystal orientation [100] in the major axis direction of the polycrystalline semiconductor film are included with an area ratio of 30% or higher.

(20) In any one of the paragraphs (6) through (15), crystal grains with crystal orientations [110], [100] and [111] in the major axis direction of the polycrystalline semiconductor film are included, and the ratio of the area occupied by the crystal grains with each crystal orientation is not higher than 70%.

(21) In any one of the paragraphs (6) through (15), crystal grains with a crystal orientation [110] in the minor axis direction of the polycrystalline semiconductor film are included with an area ratio of 25% or higher.

(22) In any one of the paragraphs (6) through (15), crystal grains with a crystal orientation [110] in the minor axis direction of the polycrystalline semiconductor film are included with an area ratio of 50% or lower, crystal grains with a crystal orientation [100] likewise are included with an area ratio of 30% or lower, and crystal grains with a crystal orientation [111] likewise are included with an area ratio of 30% or lower.

A drive circuit and a part of the aforementioned integrated circuit group of an image display device can be arranged out of thin film transistors formed out of any one of the polycrystalline semiconductor films according to the paragraphs (5) to (22).

The drive circuit and a part of the integrated circuit group can be arranged out of thin film transistors formed out of thin film transistors formed out of any one of the polycrystalline semiconductor films according to the paragraphs (5) to (22), while active layers of the other thin film transistors are produced out of a polycrystalline semiconductor film formed out of crystal grains whose crystal grain size ranges from about 10 nm to about 100 nm.

Figure 15:
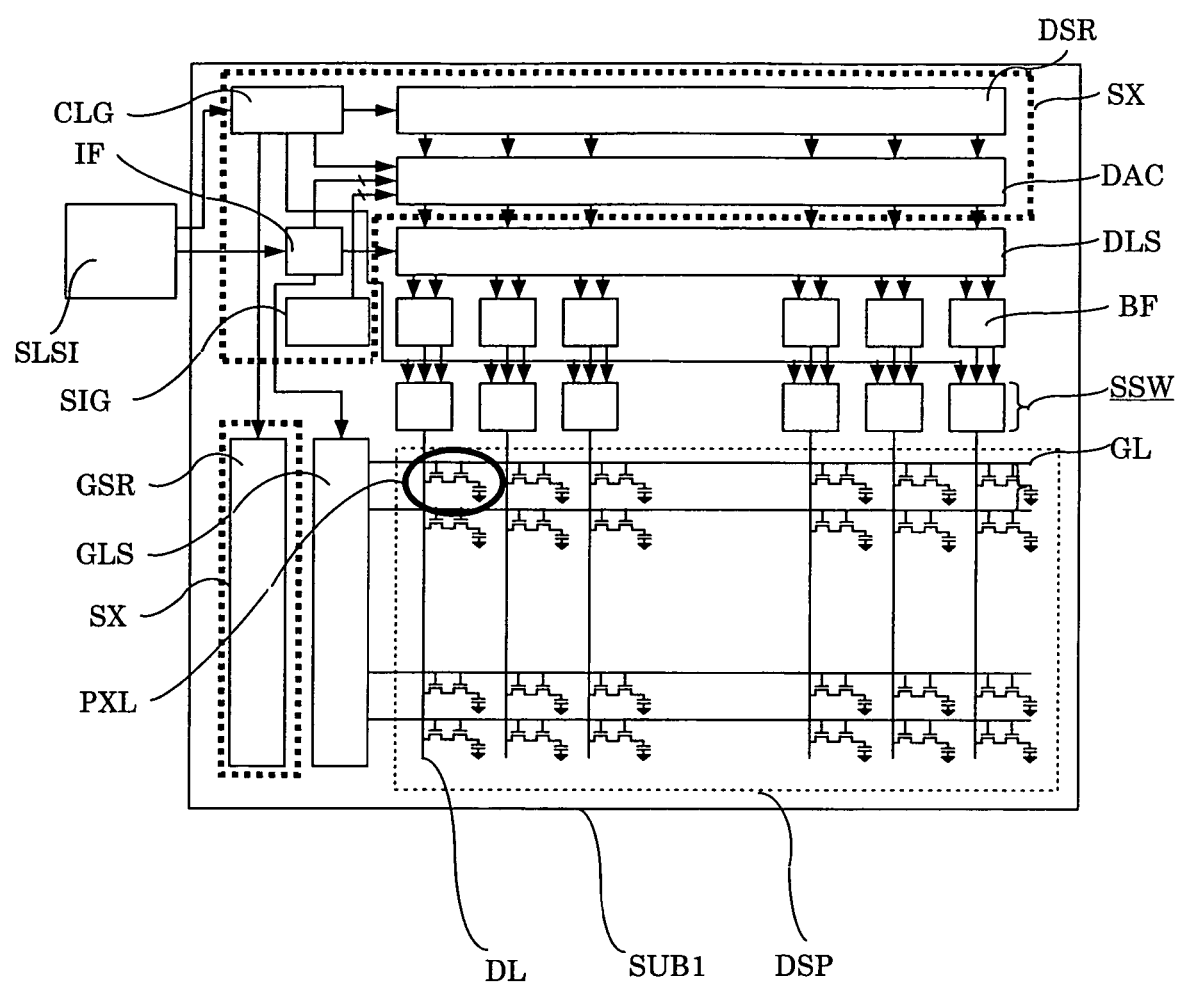
FIG. 15 is a conceptual view showing circuits for an image display device formed on a glass substrate.

FIG. 15 is a schematic plan view showing the outline of a circuit for an image display device formed on a glass substrate SUB1, for the sake of explanation of a second embodiment of the present invention. Here, description will be made using an active matrix substrate for a line-sequential display as the glass substrate SUB1 by way of example. A pixel region DSP is provided in a major part of the circuit formed on the glass substrate SUB1. Pixels PXL arrayed in a matrix in the pixel region DSP are provided near intersections between data lines DL and gate lines GL. Each pixel PXL is constituted by TFTs serving as a switch and a pixel electrode. This embodiment shows a double-gate configuration in which the switch is constituted by two TFTs, but the embodiment also includes a single-gate configuration and a multi-gate configuration.

A drive circuit region where circuits for supplying driving signals to a large number of pixels PXL formed in the pixel region DSP are formed is disposed outside the pixel region DSP. A shift register DSR, a digital-analog converter DAC, a level shifter DLS, buffers BF and sampling switches SSW are disposed on one long side (upper side in FIG. 15) of the pixel region DSP. The shift register DSR serves to make the digital-analog converter DAC read digitized display data sequentially. The digital-analog converter DAC outputs the digitized display data as a gradation voltage signal. The level shifter DLS amplifies the gradation voltage signal from the digital-analog converter DAC so as to obtain a desired gradation voltage. The sampling switches SSW inverts the polarity of the gradation voltage between adjacent pixels.

A shift register GSR and a level shifter GLS for opening gates of the pixel electrodes PXL sequentially are disposed on one short side (left side in FIG. 15) of the pixel region DSP. An interface IF, a gradation signal generator SIG, a clock signal generator CLG, etc. are disposed in the peripheries of the aforementioned circuits. The interface IF imports image data sent from a system LSI (host) into the display circuit and performs signal conversion on the image data. The clock signal generator CLG generates a clock signal for controlling timing of each circuit.

Of these circuits, the peripheral drive circuits including the interface IF, the clock signal generator CLG, the drain-side shift register DSR, the gate-side shift register GSR and the digital-analog converter DAC have to be fast enough to process digital signals. In addition, the peripheral drive circuits have to be driven with a low voltage for the sake of saving of power. On the other hand, each pixel PXL is a circuit for applying a voltage to a liquid crystal so as to modulate the transmittance of the liquid crystal. In order to secure gradation, the pixel PXL has to be driven with a high voltage. Further, in order to hold the voltage for a fixed time, each switching transistor has to have a low leak current.

The drain-side level shifter DLS, the gate-side level shifter GLS, the buffers BF and the sampling switches SSW located between the low-voltage driven circuit group and the high-voltage driven circuit group have to be driven with a voltage high enough to send a high-voltage analog signal to each pixel.

In this manner, TFTs having a plurality of directly-opposed specifications have to be mounted together in order to manufacture the image display circuits on the glass substrate SUB1. To that end, the high-quality polycrystalline semiconductor film PSIHQ is used in portions of the interface IF, the clock signal generator CLG, the drain-side shift register DSR, the gate-side shift register GSR and the digital-analog converter DAC. The range where the high-quality polycrystalline semiconductor film is used is designated by the reference sign SX. The low-quality polycrystalline semiconductor film PSILQ is used in the other circuits.

Due to the aforementioned thin film transistors, the fast circuits which have been mounted as another LSI chip outside an image display portion mounted on a glass substrate in the background art can be mounted on one and the same glass substrate together with the image display portion. Thus, the LSI chip cost can be saved, and a non-pixel region in the peripheral portion of a panel can be cut down. In addition, customization of the circuits which have been performed in the step of designing and producing the LSI chip in the background art can be performed in the step of manufacturing the panel.

Figure 16:
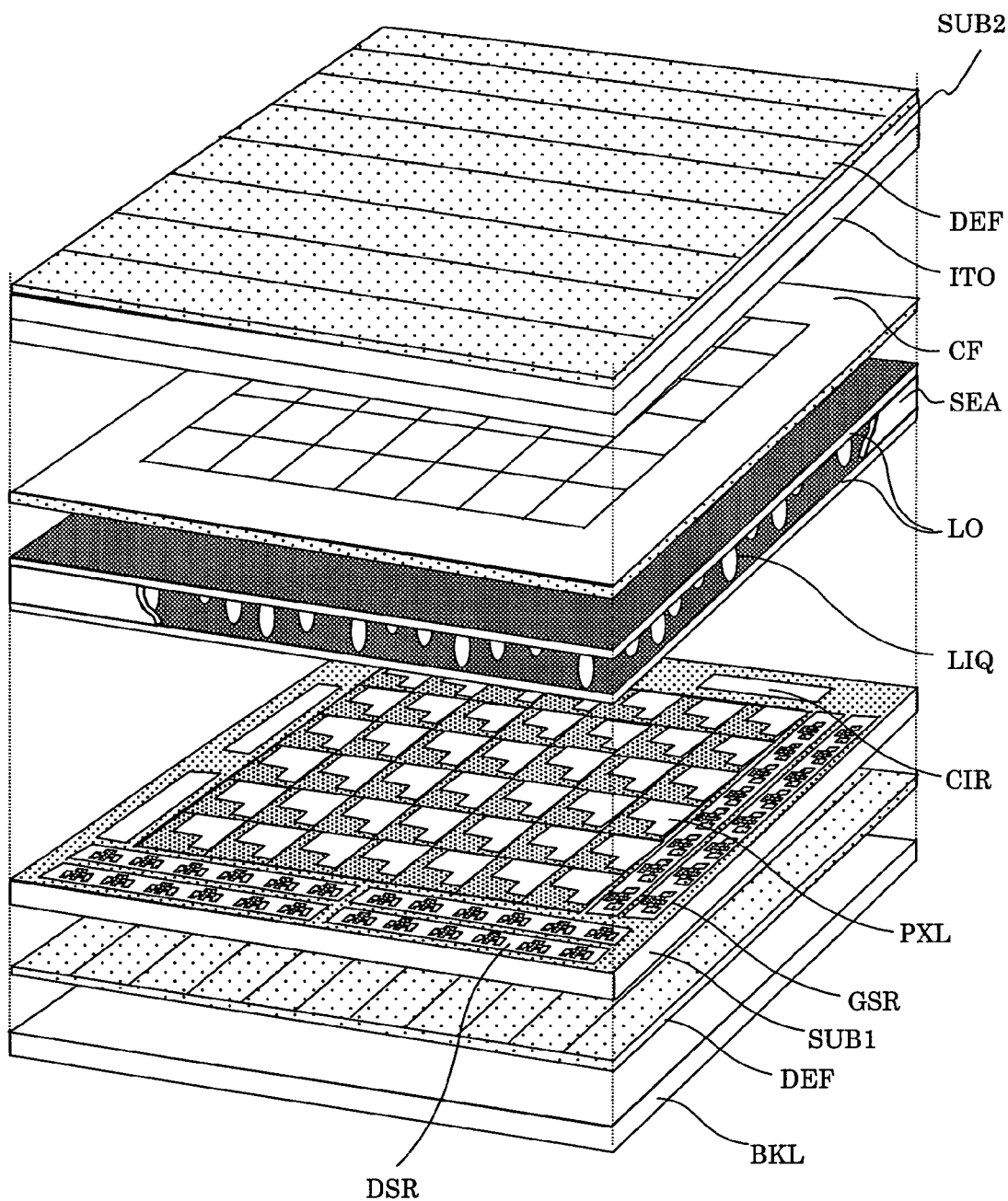
FIG. 16 is a schematic view of an embodiment where an image display device according to the present invention is applied to a liquid crystal display device.

FIG. 16 is an exploded perspective view for schematically explaining an embodiment where an image display device according to the present invention is applied to a liquid crystal display device. A plurality of pixel electrodes PXL disposed in a matrix, circuits DSR and GSR for inputting a display signal to the pixel electrodes, and a circuit group CIR required for image display are formed on a glass substrate (active matrix substrate or thin film transistor substrate) SUB1 which is one of substrates. An orientation film LO is applied to the glass substrate SUB1 as a top layer by a printing method. The other glass substrate (opposed substrate or color filter substrate) SUB2 applied with a color filter CF, an opposed electrode ITO and an orientation film LO is bonded. Liquid crystals LIQ are charged between the opposed orientation films LO by vacuum injection, and the liquid crystals are sealed off by a sealant SEA.

After that, polarizing plates DEF are bonded, and a backlight BK is attached. Thus, a liquid crystal display device is completed. Although a liquid crystal display device using a color filter substrate is described here by way of example, the embodiment can be also applied to a liquid crystal display device where a color filter is formed on the active matrix substrate side.

Figure 17:
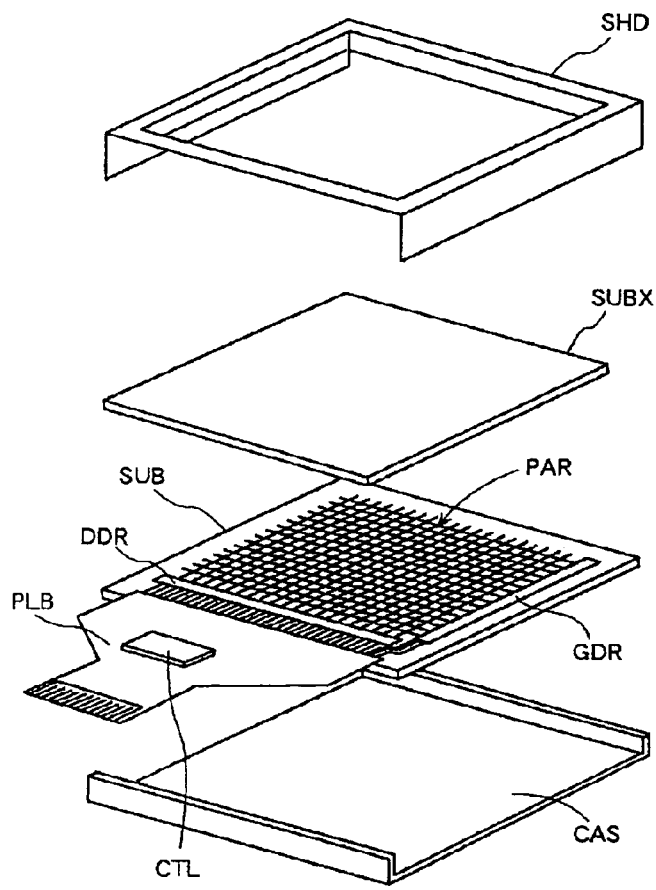
FIG. 17 is an exploded perspective view for explaining an example of a configuration of an organic EL display device using an image display device according to the present invention.
Figure 18:
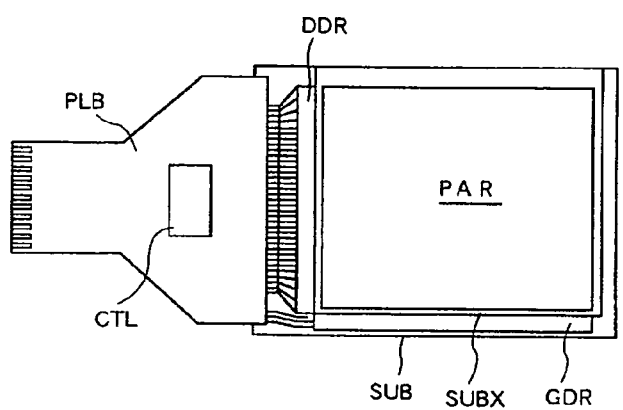
FIG. 18 is a plan view of the organic EL display device in which constituent parts shown in FIG. 17 are integrated.

Further, an organic EL display device can be manufactured using the active matrix substrate manufactured in the embodiment of the manufacturing method according to the present invention. FIG. 17 is an exploded perspective view for explaining an example of the configuration of the organic EL display devices as the second embodiment of the image display device according to the present invention. FIG. 18 is a plan view of the organic EL display device in which the constituent parts shown in FIG. 17 have been integrated. Organic EL devices are formed on the pixel electrodes provided on the aforementioned active matrix substrate SUB1. The organic EL devices are composed of a lamination in which a hole transport layer, a light emission layer, an electron transport layer, a cathode metal layer, etc. have been deposited in turn from the surface of each pixel electrode.

A sealant is disposed around a pixel region PAR of the active matrix substrate SUB1 where such a lamination has been formed, and the pixel region PAR is sealed with a sealing substrate SUBX or a sealing can. According to this organic EL display device, a display signal is supplied from an external signal source to a drive circuit region DDB through a printed circuit board PLB. The display device is integrated by a shield frame SHD serving as an upper casing and a lower casing CAS. Thus, an organic EL display device is formed.

In active matrix drive for the organic EL display device, a high-performance pixel circuit is essentially used for provision of a high-quality image because the organic EL devices are driven in a current-drive emission system. It is desired to use a pixel circuit of CMOS thin film transistors. Each thin film transistor circuit to be formed in the drive circuit region has to be fast to attain high definition. The active matrix substrate SUB1 in this embodiment has performance high enough to satisfy these requests. The organic EL display device using the active matrix substrate according to the embodiment is one of display devices showing the features of the embodiment to the full.

Figure 19:
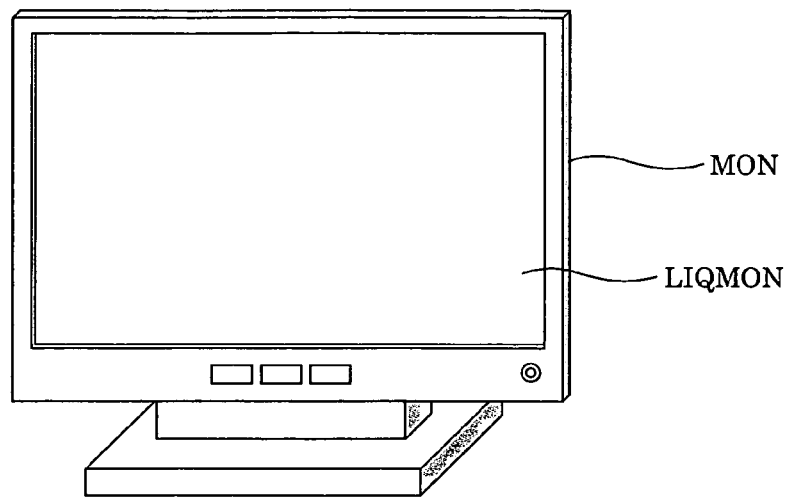
FIG. 19 is a view showing an example of an application to an image display portion of a monitor for use in a personal computer or a TV set.

FIGS. 19 to 22 show examples of applications of image display devices according to the present invention. FIG. 19 is a front view showing an example of an application where a liquid crystal display device LIQMON according to the present invention is mounted in an image display portion of a monitor MON for use in a personal computer or a TV set.

Figure 20:
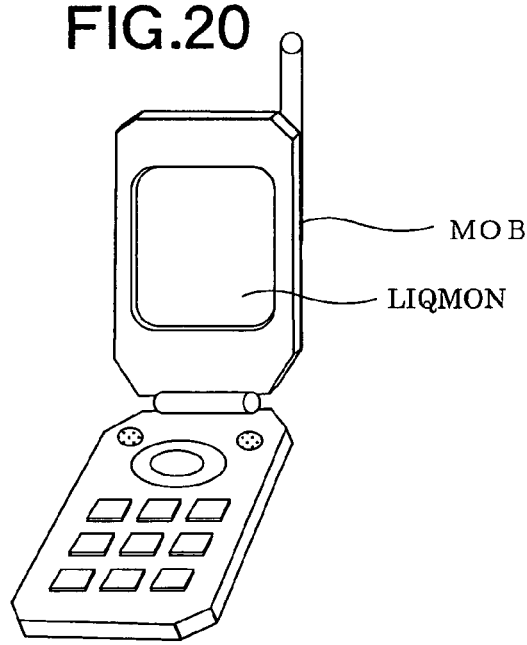
FIG. 20 is a view showing an example of an application to an image display portion of a cellular phone MOB.

FIG. 20 is a front view showing an example of an application where a liquid crystal display device LIQMON according to the present invention is used in an image display portion of a cellular phone MOB.

Figure 21:
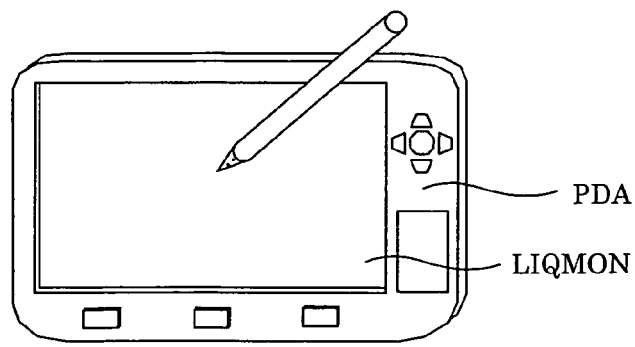
FIG. 21 is a view showing an example of an application to an image display portion of a digital portable terminal PDA.

FIG. 21 is a front view showing an example of an application where a liquid crystal display device LIQMON according to the present invention is used in an image display portion of a digital portable terminal PDA.

Figure 22:
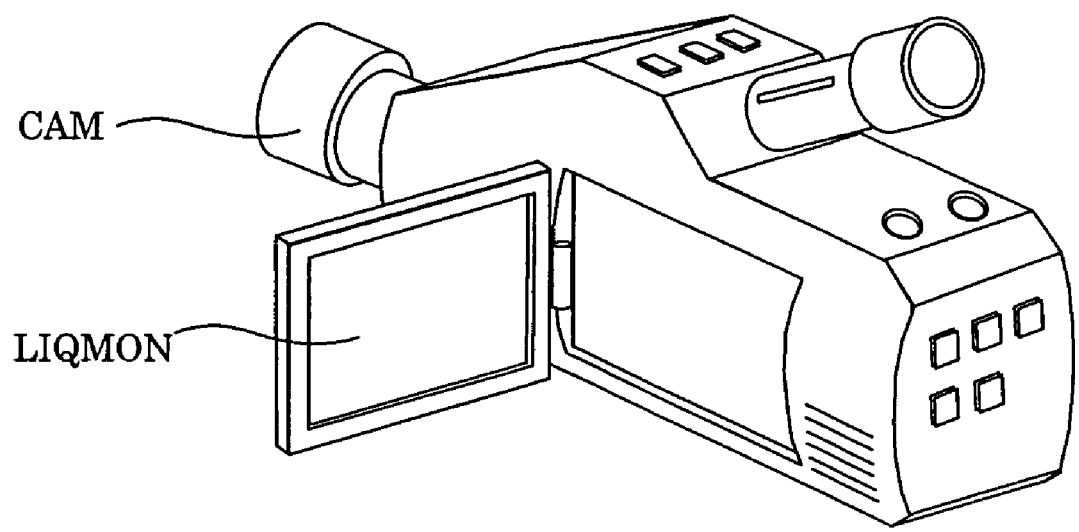
FIG. 22 is a view showing an example of an application to a view finder portion of a projector CAM.

FIG. 22 is a front view showing an example of an application where a liquid crystal display device LIQMON according to the present invention is used in a view finder portion of a video camera CAM.

In addition to the aforementioned applications, image display devices according to the present invention can be used in image display portions of digital still cameras, projectors, on-vehicle navigation systems, etc.

The present invention is not limited to the active matrix substrate of the image display device, or not limited to the configurations stated in the claims and the configurations described in the embodiments. Various changes can be made on the invention without departing from the technical idea thereof. For example, the present invention can be applied to various semiconductor devices.

In order to heighten the added value of a TFT-driven display, it is essential to mount a high-performance processing circuit. To that end, it is necessary to improve the crystallinity of a polycrystalline semiconductor serving as an active layer, while it is desired to keep a polycrystalline semiconductor in an active layer portion of a pixel circuit as it is in the background art. The present invention is to provide a method for manufacturing an image display device without introducing another apparatus newly. Accordingly, the applicability of the present invention is high.

What is claimed is:

1. A method for manufacturing an image display device including a pixel circuit serving as an image display portion, a drive circuit for driving the pixel circuit, an integrated circuit group for processing and converting an external input signal into a signal required for displaying an image, and transmitting the signal to the drive circuit, and an insulating substrate on which the pixel circuit, the drive circuit and the integrated circuit group are formed, the method comprising the steps of:

scanning crystal grains with a first energy beam so as to grown the crystal grains in a direction of the scan to thereby form a polycrystalline semiconductor thin film of first crystal grains; and performing a second rapid thermal treatment upon the polycrystalline semiconductor thin film of the first crystal grains so as to reduce defects in the crystal grains.

2. A method for manufacturing an image display device according to claim 1, wherein the second rapid thermal treatment is performed in a melting recrystallization method in which the semiconductor thin film is irradiated with a pulsed energy beam once or a plurality of times or in a solid-phase growth method using a rapid thermal annealing method.

3. A method for manufacturing an image display device according to claim 1, wherein a region other than the polycrystalline semiconductor thin film poly-crystallized while growing the first crystal grains in the direction of the scan and subjected to the second rapid thermal treatment to thereby reduce the defects in the crystal grains is polycrystalline with a crystal grain size ranging from about 10 nm to about 100 nm.

4. A method for manufacturing an image display device according to claim 1, wherein:

the polycrystalline semiconductor thin film grown into the first crystal grains is formed in a method in which the semiconductor thin film is irradiated with an energy beam continuously or temporarily irradiated with an energy beam outputting energy for a fixed period once or a plurality of times so as to poly-crystallize the crystal grains while extending the crystal grains in the growing direction of the crystal grains; and the second rapid thermal treatment is performed in a method in which the semiconductor thin film is irradiated with an energy beam having lower energy than the energy beam for a short time by one and the same apparatus for generating the energy beam.

5. A method for manufacturing an image display device according to claim 1, wherein a time when the semiconductor thin film is in a solid phase exists between the step of growing the first crystal grains in the direction of the scan with the first energy beam to thereby form a polycrystalline semiconductor thin film and the step of performing the second rapid thermal treatment so as to reduce defects in the crystal grains.

6. A method for manufacturing an image display device according to claim 1, wherein a time when the semiconductor thin film is in a liquid phase exists between the step of growing the first crystal grains in the direction of the scan with the first energy beam to thereby form a polycrystalline semiconductor thin film and the step of performing the second rapid thermal treatment so as to reduce defects in the crystal grains.

7. A method for manufacturing an image display device according to claim 1, wherein the polycrystalline semiconductor thin film grown into the first crystal grains is formed in a method in which the semiconductor thin film is irradiated with an energy beam outputting energy continuously or temporarily irradiated for a fixed period once or a plurality of times so as to poly-crystallize the crystal grains while extending the crystal grains in the growing direction.

8. A method for manufacturing an image display device according to claim 1, wherein the polycrystalline semiconductor thin film grown into the first crystal grains is formed in a method in which a catalyst such as metal is introduced into the semiconductor thin film or onto a surface or an interface thereof, and thermal energy is given thereto so as to accelerate poly-crystallization in the growing direction to thereby make the semiconductor thin film polycrystalline.

* * * * *